(12) United States Patent
Luk et al.

(10) Patent No.: US 7,027,326 B2
(45) Date of Patent: Apr. 11, 2006

(54) 3T1D MEMORY CELLS USING GATED DIODES AND METHODS OF USE THEREOF

(75) Inventors: Wing K. Luk, Chappaqua, NY (US); Robert H. Dennard, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 10/751,713

(22) Filed: Jan. 5, 2004

(65) Prior Publication Data

US 2005/0146928 A1   Jul. 7, 2005

(51) Int. Cl.
G11C 11/36 (2006.01)
G11C 11/24 (2006.01)
G11C 8/16 (2006.01)

(52) U.S. Cl. ............... 365/175; 365/149; 365/187; 365/188; 365/230.05

(58) Field of Classification Search ............ 365/175, 365/149, 187, 188, 105, 184, 230.05, 150, 365/159; 257/E21.362, E29.195
See application file for complete search history.

(56) References Cited

U.S. PATENT DOCUMENTS

| 4,308,594 A * | 12/1981 | Jiang ........................ 365/187 |
| 5,841,690 A * | 11/1998 | Shibutani et al. ............ 365/149 |
| 2005/0128803 A1* | 6/2005 | Luk et al. .................... 365/175 |
| 2005/0145895 A1* | 7/2005 | Luk et al. .................... 257/288 |

OTHER PUBLICATIONS

Luk et al., "Gated Diode Memory Cells," U.S. Appl. No. 10/735,061 (filed Dec. 11, 2003).
Luk et al., "Amplifiers Using Gated Diodes," U.S. Appl. No. 10/751,714 (filed Jan. 5, 2004).

* cited by examiner

Primary Examiner—Richard Elms
Assistant Examiner—J. H. Hur
(74) Attorney, Agent, or Firm—Ryan, Mason & Lewis, LLP

(57) ABSTRACT

A memory cell comprises: (1) a write switch, the first terminal of the write switch coupled to an at least one bitline, the control terminal of the write switch coupled to the first control line; (2) a two terminal semiconductor, the first terminal of the two terminal semiconductor device coupled to the second terminal of the write switch, and the second terminal of the two terminal semiconductor device coupled to an at least one second control line, wherein the two terminal semiconductor device has a capacitance when a voltage on the first terminal relative to the second terminal is above a threshold voltage and has a lower capacitance when the voltage on the first terminal relative to the second terminal is less than the threshold voltage; (3) a read select switch, the control terminal of the read select switch coupled to an at least one second control line, the first terminal of the read select switch coupled to the at least one bitline; and (4) a read switch, the control terminal of the read switch coupled to the first terminal of the gated diode and coupled to the second terminal of the write switch, the first terminal of the read switch coupled to the second terminal of the read select gate, and the second terminal of the read switch coupled to ground.

42 Claims, 23 Drawing Sheets

GATED DIODE CAPACITANCE vs GATE-TO-SOURCE VOLTAGE (Vgs)
EACH CURVE REPRESENTS A DIFFERENT GATED DIODE GATE SIZE.
THRESHOLD VOLTAGE = 0.2 V

GATED DIODE AMPLIFIER REPRESENTATIVE CIRCUIT

GATED DIODE AMPLIFIER REPRESENTATIVE CIRCUIT

FIG. 25

3T1D MEMORY CELLS USING GATED DIODES AND METHODS OF USE THEREOF

CROSS REFERENCE TO RELATED APPLICATIONS

This application is related to an application by Luk et al., entitled AMPLIFIERS USING GATED DIODES, U.S. patent Ser. No. 10/751,714, filed on the same day as the present application and assigned to International Business Machines, Inc., the disclosure of which is hereby incorporated by reference.

FIELD OF THE INVENTION

The present invention relates to semiconductors and, more particularly, relates to semiconductor memory.

BACKGROUND OF THE INVENTION

In the past few decades, Dynamic Random Access Memories (DRAMs) have been delivering higher density but slower speed, and Static Random Access Memories (SRAMs) the higher speed but lower density. These two memory types have been developed separately, following their own technological development curves for density and speed. Recently, embedded memory of DRAM and SRAM began to emerge. Embedded memory is memory on the same "chip" as a processor. Currently, each of DRAM and SRAM also faces its own technology challenge along its particular scaling path, namely due to high standby and active leakage current (both sub-threshold and tunneling), threshold voltage variation and mismatch. Embedded memory opens up possibilities and demands for new memory cells for better optimization and trade-off between speed, area, power, retention time, soft error rate, and technology parameters such as threshold voltages and leakage currents. Embedded memory on a chip will generally be deployed onto specific processors or Application Specific Integrated Circuits (ASICs), based on the chip and application requirements.

DRAM, in particular, would be useful for embedded memory and the cells thereof if the DRAM could be made smaller and substantially faster, and be suitable for smaller voltages, as voltages are continuing to decrease.

Thus, there is a need to provide improved memory cells and memories using the cells.

SUMMARY OF THE INVENTION

Exemplary aspects of the present invention provide improved memory cells, memory arrays, and methods of using the same.

In an exemplary aspect of the invention, a memory cell is disclosed. The memory cell is configured to be coupled to a first control line, at least one second control line and at least one bitline for selectively accessing the memory cell. The memory cell comprises a write switch having a control terminal and first and second terminals, the first terminal of the write switch coupled to the at least one bitline, and the control terminal of the write switch coupled to the first control line. The memory cell also has a two terminal semiconductor device having first and second input terminals, the first input terminal of the two terminal semiconductor device coupled to the second terminal of the write switch, and the second input terminal of the two terminal semiconductor device coupled to the at least one second control line. The two terminal semiconductor device is used as a charge storage device in the memory cell. The two terminal semiconductor device is adapted to have a capacitance when a voltage on the first input terminal relative to the second input terminal is above a threshold voltage and to have a lower capacitance, typically substantially smaller, when the voltage on the first input terminal relative to the second input terminal is less than the threshold voltage.

The memory cell additionally comprises a read select switch having a control terminal and first and second terminals, the control terminal of the read select switch coupled to the at least one second control line, and the first terminal of the read select switch coupled to the at least one bitline. The memory cell also has a read switch having a control terminal and first and second terminals, the control terminal of the read switch coupled to the first input terminal of the two terminal semiconductor device and coupled to the second terminal of the write switch, the first terminal of the read switch coupled to the second terminal of the read select gate, and the second terminal of the read switch coupled to ground.

The two terminal semiconductor device can be a gated diode, which is a semiconductor device comprised of a source and a gate, where charge is stored in an inversion layer when the gate to source voltage (Vgs) is above a threshold voltage, and substantially less or no charge is stored otherwise. Specifically, when the gate to source voltage (Vgs) is above a threshold voltage, the two terminal device has a capacitance, and when the gate to source voltage (Vgs) is below the threshold voltage, the capacitance is substantially smaller or orders of magnitude smaller. The switches are typically implemented as Field Effect Transistors (FETs) and the gated diode is typically implemented as a "partial" FET, and FETs in the memory cell may be n-type or p-type FETs. Additionally, the two terminal semiconductor device may be implemented as an n-type or a p-type semiconductor device.

In another exemplary aspect of the invention, arrays using the memory cells are disclosed. Such arrays can have more than one bitline and a number of control lines. For example, single port or dual port memory cells may be used. If desired, even higher numbers of ports may be used. The control lines may be implemented in a number of ways. Illustratively, the at least one second control line can be a single control line coupled to both the read select switch and the second terminal of the two terminal semiconductor device. Having a single second control line allows, for instance, reading, writing, and read boosting (e.g., where a higher voltage is created in the memory cell by varying the voltage on the second terminal of the two terminal semiconductor device). As another example, the second control line can be split into two control lines, a write control line that is coupled to the second terminal of the two terminal device and a read select control line coupled to the control terminal of the read select switch. This configuration allows reading, read boosting, writing, and write boosting (e.g., which allows a boosted voltage to be stored in the memory cell). Additionally, this configuration allows a voltage to be placed on the read select switch so that leakage current of the read select switch (e.g., as an FET) is minimized.

In another exemplary aspect of the invention, methods for accessing memory cells are disclosed. A cell is read by modifying a voltage on the second terminal of the two terminal semiconductor device. Typically, a voltage on the second terminal of the two terminal semiconductor device is raised from a small voltage (e.g., ground) to a large voltage (e.g., "VB"). However, the modification can depend on whether n-type or p-type devices are being used. If the cell stores a high voltage (e.g., a data one value), the two terminal semiconductor device will have a large capacitance and a large amount of charge stored, and voltage on the first terminal will be raised (e.g., above the data-one stored cell voltage) by about the voltage on the second terminal of the two terminal semiconductor device. If the cell stores a low voltage (e.g., a data zero value), the two terminal semiconductor device will have a small or nonexistent capacitance and a very small or no charge stored, and voltage on the first terminal will be raised (e.g., above the data-zero stored cell voltage) by a very small amount. Modifying voltage of the second terminal of the two terminal gated device while reading the memory cell is called read boosting.

Write boosting may also be performed by raising the voltage of the second terminal of the two terminal semiconductor device while writing a value into the memory cell. Write boosting allows a much higher voltage, for data one, than the given writing voltage, hence resulting in longer storage time when a data one value is stored in the cell.

In another exemplary aspect of the invention, a semiconductor has a semiconductor memory device configured to be coupled to a first control line, at least one second control line and at least one bitline for selectively accessing the semiconductor memory device. The semiconductor memory device comprises a write transistor comprising an insulator formed between a gate and a well, the gate, and first and second source/drain diffusion regions formed on sides of the gate, the first source/drain diffusion region of the write transistor coupled to at least one bitline, the gate of the write transistor coupled to the first control line. The semiconductor memory device further comprises a two terminal semiconductor device comprising at least an insulator formed between a gate and a well, the gate, and a source diffusion region that abuts at least a portion of the insulator, the gate of the two terminal semiconductor device coupled to the second source/drain diffusion region of the write switch, and the source diffusion region of the two terminal semiconductor device coupled to the at least one second control line. The semiconductor memory device also comprises a read select transistor comprising an insulator formed between a gate and a well, the gate, and first and second source/drain diffusion regions formed on sides of the gate, the gate of the of the read select switch coupled to the at least one second control line, the first source/drain diffusion region of the read select transistor coupled to the at least one bitline. The semiconductor memory device additionally comprises a read transistor comprising an insulator formed between a gate and a well, the gate, and first and second source/drain diffusion regions formed on sides of the gate, the gate of the read transistor coupled to the first terminal of the two terminal semiconductor device and coupled to the second source/drain diffusion region of the write transistor, the first source/drain diffusion region of the read transistor coupled to the second source/drain diffusion region of the read select gate, and the second source/drain diffusion region of the read transistor coupled to ground.

A more complete understanding of the present invention, as well as further features and advantages of the present invention, will be obtained by reference to the following detailed description and drawings.

BRIEF DESCRIPTION OF THE DRAWINGS

FIG. 11C shows a representative circuit for the gated diode circuit of FIG. 11A when the gated diode is turned on;

FIGS. 23–25 are circuit diagrams and global structures illustrating several memory arrays using 3T1D gated diode memory cells.

DETAILED DESCRIPTION OF PREFERRED EMBODIMENTS

Figure 1A:
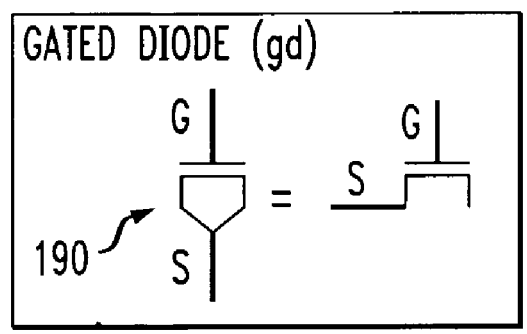
FIG. 1A shows exemplary symbols used for a first n-type gated diode.

This disclosure describes high speed, non-destructive read memory cells based on gated diodes, and associated arrays and silicon structures that can be readily implemented in regular logic-based bulk silicon and Silicon-On-Insulator (SOI). The target performance of the memory cells can be comparable to or even better than Static Random Access Memory (SRAM) speed, but can occupy an area 50 to 70 percent of that of SRAM for the same generation of technology. Due to a high gain characteristic of the memory cell itself, the memory can operate at a much lower supply voltage, much less than that required by conventional Dynamic Random Access Memory (DRAM) and SRAM. An important emphasis herein is on the high speed aspects of the memory cells and architecture, with sufficient retention time and low soft error rate in mind.

For ease of reference, the following disclosure is separated into the following sections: Introduction and Gated Diode Structures; Gated Diode Circuits; 3T1D Memory Cells; Voltage Boosting and Voltage Gain; Retention Time, Leakage and Capacitance Ratio; Retention Time and Sub-Threshold Leakage Control for Write Gate; Method of Read Operation and Voltage Boosting; Method of Write Operation and Voltage Boosting; 3T1D Memory Cell Structures; and 3T1D Gated Diode Memory Arrays.

Introduction and Gated Diode Structures

The term "gated diode" as used herein refers to a semiconductor device typically comprised of a source and a gate, where charge stored in an inversion layer when the gate to source voltage (Vgs) is above a threshold voltage, and substantially less or no charge is stored otherwise. A gated diode is an example of a two terminal semiconductor device. Any two terminal semiconductor device may be used having the property that the two terminal semiconductor device has a (typically large) capacitance when a voltage on the first terminal relative to the second terminal is larger than a predetermined voltage and a smaller capacitance (typically a much smaller capacitance) when a voltage on the first terminal relative to the second terminal is smaller than the predetermined voltage. The predetermined voltage is called a threshold voltage herein, and it usually only takes a small amount of voltage above the threshold voltage for the capacitance to increase. Thus, the capacitance of the two terminal semiconductor device is nonlinear. For instance, for a gated diode created using n-type Field Effect Transistor (FET) technology, voltages above a threshold voltage cause a large amount of charge to be stored in an inversion layer and voltages below the threshold voltage cause a substantially small amount of charge, orders of magnitude smaller, or no charge to be stored. For future technology, beyond bulk silicon and Silicon-On-Insulator (SOI), this gate-to-source property can be used when implementing memory cells and circuits based on gated diodes, as is explained below.

As shown in the following figures, in a conventional Field Effect Transformer (FET) setting, a gated diode can be formed by the source and the gate of a three terminal FET device (either n-type or p-type), with the drain floating (e.g., disconnected or nonexistent), as shown in (for example) FIGS. 1B, 4B, 6 and 8. In this exemplary form, a gated diode is implemented in the form of a "partial" FET or a "half" FET. Sometimes the source and drain of such a FET can be connected together at the same potential an may be viewed as two gated diodes connected in parallel, as shown in (for example) FIGS. 2B, 5B, 7 and 9. In this disclosure, these two different gated diodes are used interchangeably. And without specifying explicitly, a gated diode is referred to just the first basic form, only a source and a gate of a semiconductor device.

Figure 1B:
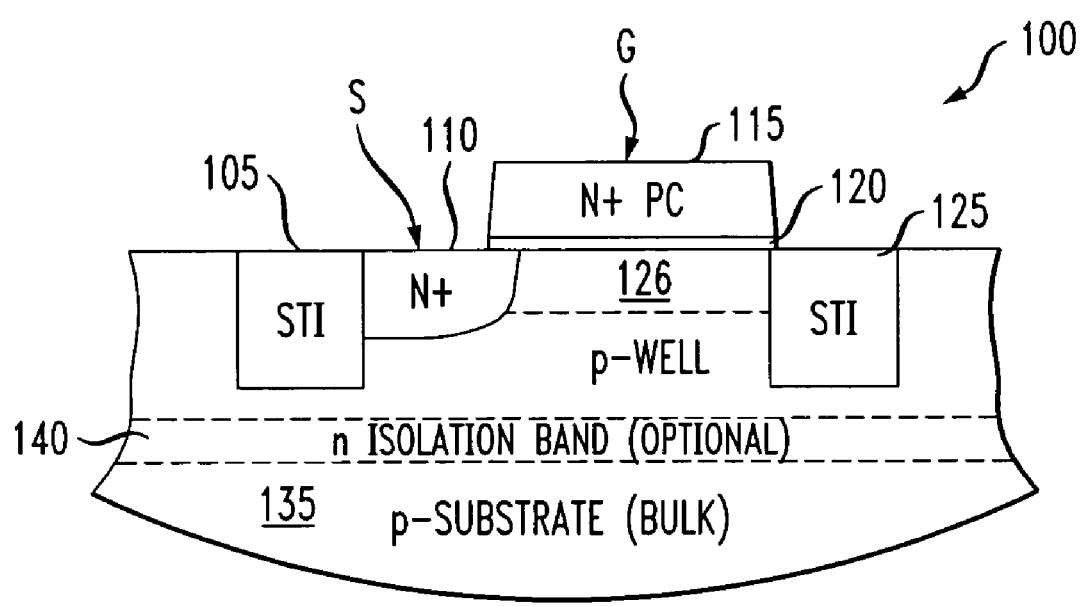
FIG. 1B shows an example of a side view of the first n-type gated diode formed in a semiconductor.

FIG. 1A shows exemplary symbols used for a first n-type gated diode. Symbol 190 is an exemplary symbol for a first n-type gated diode shown in FIGS. 1A–1C. FIG. 1B shows an example of a side view of the first n-type gated diode 100 formed in a semiconductor. The first n-type gated diode 100 comprises a gate insulator 120 formed between a gate 115 (e.g., N+ doped polysilicon) and a p-well 130, a source diffusion region 110, two Shallow Trench Isolation (STI) regions 105 and 125, an optional n isolation band 140, and a p-substrate 135. As described below, the dopant concentration in p-well 130 substantially controls the threshold voltage of the gated diode 100.

Figure 2A:
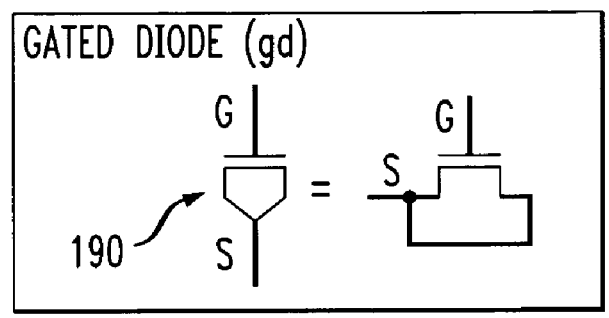
FIG. 2A shows exemplary symbols used for a second n-type gated diode.
Figure 2B:
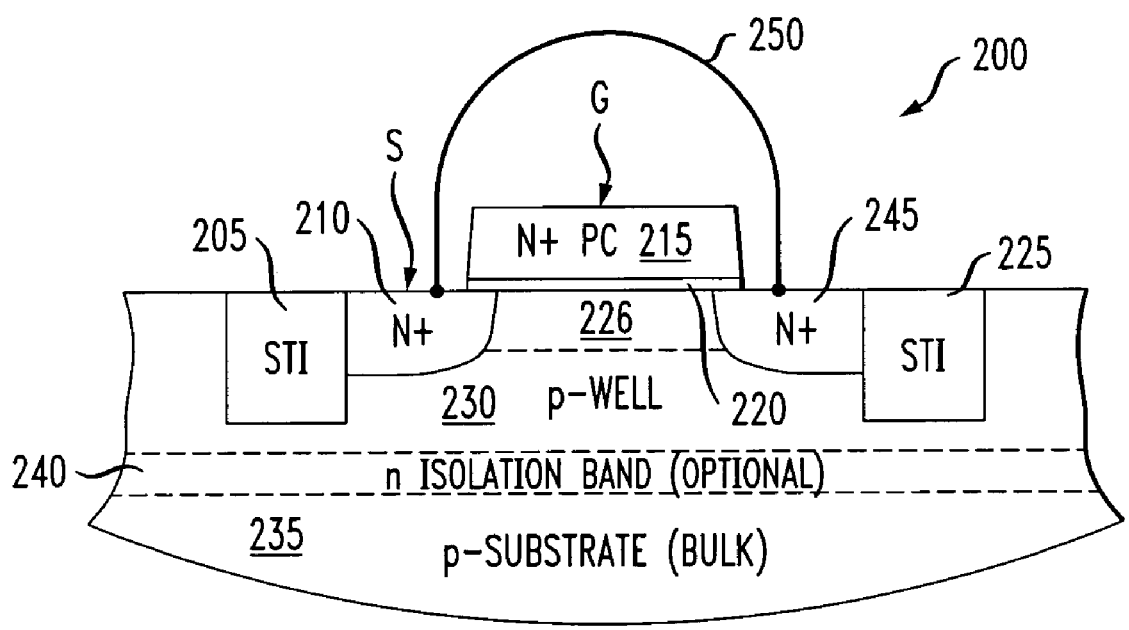
FIG. 2B shows an example of a side view of the second n-type gated diode formed in a semiconductor.

FIG. 2A shows exemplary symbols used for a second n-type gated diode. Symbol 190 is an exemplary symbol for a second n-type gated diode shown in FIGS. 2A–2C. The same symbol 190 is used for both FIGS. 1A and 2A. FIG. 2B shows an example of a side view of the second n-type gated diode 100 formed in a semiconductor. The second n-type gated diode 200 comprises a gate insulator 220 formed between a gate 215 (e.g., N+ doped polysilicon) and a p-well 230, a source diffusion region 210, two STI regions 205 and 225, an optional n isolation band 240, a p-substrate 235, a "drain" diffusion region 245 (e.g., a second source/drain diffusion region), and an interconnection 250 that electrically couples source diffusion region 210 and "drain" diffusion region 245. As described below, the dopant concentration in p-well 230 substantially controls the threshold voltage of the gated diode 100.

Figure 3A:
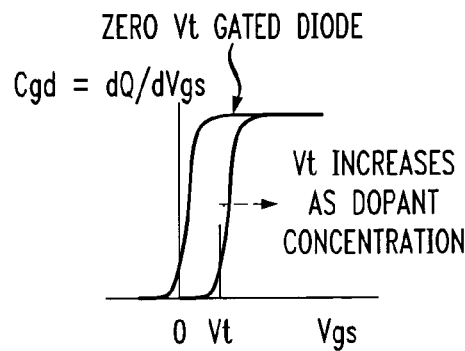
FIG. 3A is a graph illustrating how dopant concentration affects threshold voltage for gated diodes.
Figure 3B:
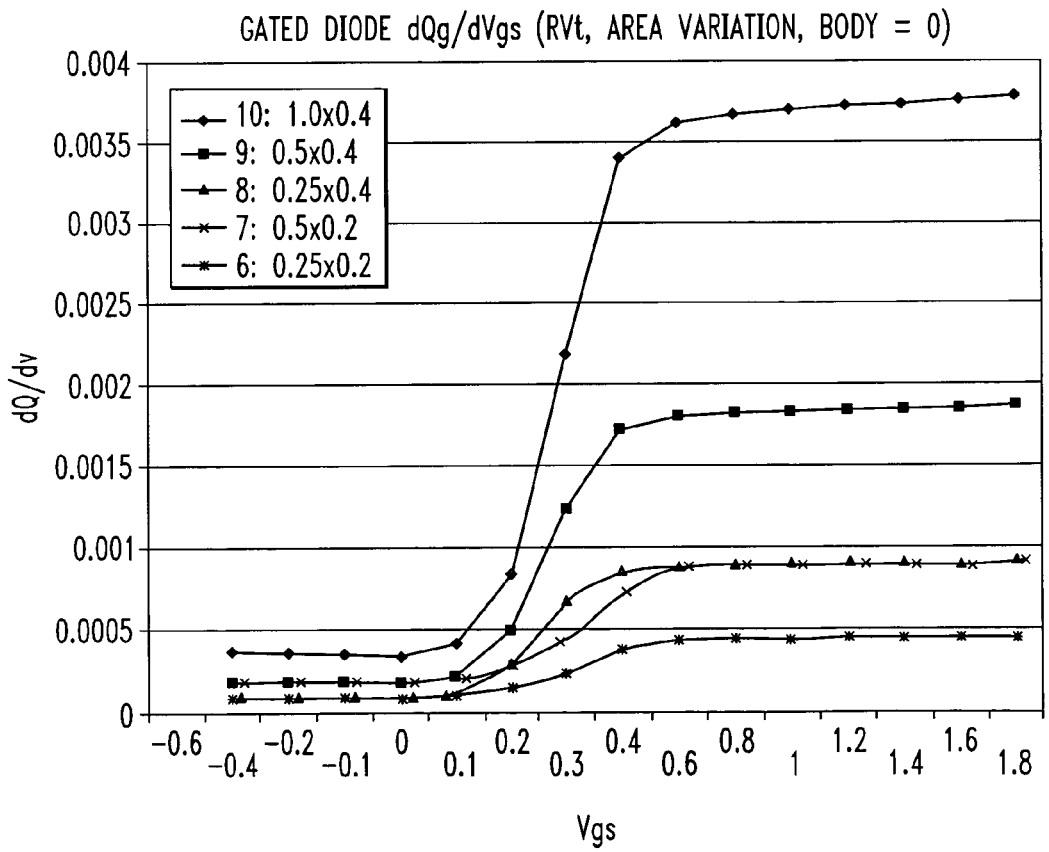
FIG. 3B is a graph illustrating how the capacitance of a gated diode varies with its gate to source voltage (Vgs), across gated diodes of different sizes.

FIGS. 3A and 3B show how charge stored by the gated diode 100/200 varies with gate to source voltage (Vgs). When a voltage corresponding to a high voltage (e.g., data one) is present at the gate 115/215, and the gate to source voltage (Vgs) is higher than the threshold voltage (Vt) of the gated diode 100/200, charge is stored in the gate 115/215 (e.g., through the inversion layer 126/226 formed underneath the gate 115/215). When a voltage corresponding to a low voltage (e.g., data zero) is present at the gate 115/215, and the gate to source voltage (Vgs) is lower than the threshold voltage of the gated diode 100/200, no or very little charge is stored in the gate 115/215 (e.g., no or very little charge is stored underneath the gate 115/215, as the inversion layer 126/226 will not exist). Thus, the capacitance characteristic of a gated diode versus gate to source voltage (Vgs) is shown in FIG. 3A. The capacitance (e.g., as determined by charge stored divided by voltage) is negligible when Vgs is below the threshold voltage, and increases directly with Vgs when Vgs is above the threshold voltage, and settles at a maximum value above certain values of Vgs. When Vgs is above the threshold voltage, a certain amount of charge is stored in the gated diode, and the gated diode acts as a capacitor. When Vgs is below the threshold voltage, the gated diode 100/200 is of negligible capacitance. The area under the graph is the amount of charge stored. It is this varying capacitance over Vgs that gives rise to many new and useful circuits in memories and logic circuits.

The gated diode 100/200 threshold voltage, over a wider range of zero Vt, low Vt, regular Vt, and high Vt can be controlled much more precisely by the amount of implantation (e.g., dopant diffused into p-well 130, 230 or the wells shown in figures below) during manufacturing. Because Vt increases as dopant concentration increases, and a zero Vt or very low Vt gated diode requires little or no dopant implantation, more precise threshold voltage results that is less sensitive to process variation for the memory cells used herein.

FIG. 3B shows also how the capacitance of a gated diode varies with the size of the gate of the gated diode. The maximum value of the capacitance of a gated diode obtained when Vgs is substantially above the threshold voltage is approximately proportional to the area of the gate of the gated diode, for a given gate oxide thickness and dielectric constant.

Since gated diodes store a significant amount of charge in the inversion layer when gate to source voltage (Vgs) is above threshold, representing data one, and very little or no charge for data zero, a gated diode memory cell (described in more detail below) has an intrinsic high gain (e.g., greater than one) characteristic. Moreover, when using boosting techniques, the gated diode memory cell can be written with a much lower bitline voltage, much less than that required by DRAM and SRAM (e.g., typically 50% for the same technology). The gated diode, such as gated diode 100/200, forms a storage cell whose voltage can be boosted, typically only for when writing or reading a data one value, during read and write. The boosting has no effect for the opposite data, namely data zero. As a result, the gated diode memory cells achieve voltage gain. This gain characteristic is unique and is one item that differentiates a gated diode memory cell from other SRAM, DRAM and gain cells.

It is assumed herein that voltages corresponding to a data one are high voltages for the technology being used and that voltage corresponding to a data zero are low voltages for the technology. However, this is only an assumption and the logic levels could be reversed.

In the disclosure, if it is not mentioned explicitly, a gated diode is assumed to be an n-type. For p-type gated diode, voltages and operations are complementary to the n-type, and can be readily designed correspondingly, by someone who is skilled in the art.

Figure 4A:
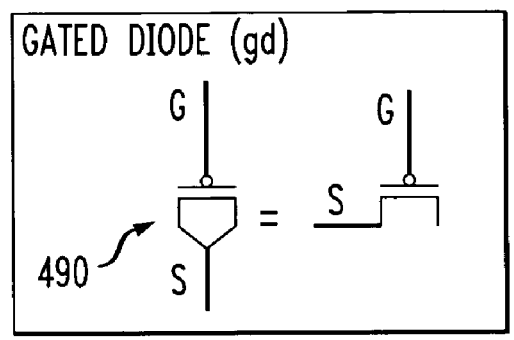
FIG. 4A shows exemplary symbols used for a first p-type gated diode.
Figure 4B:
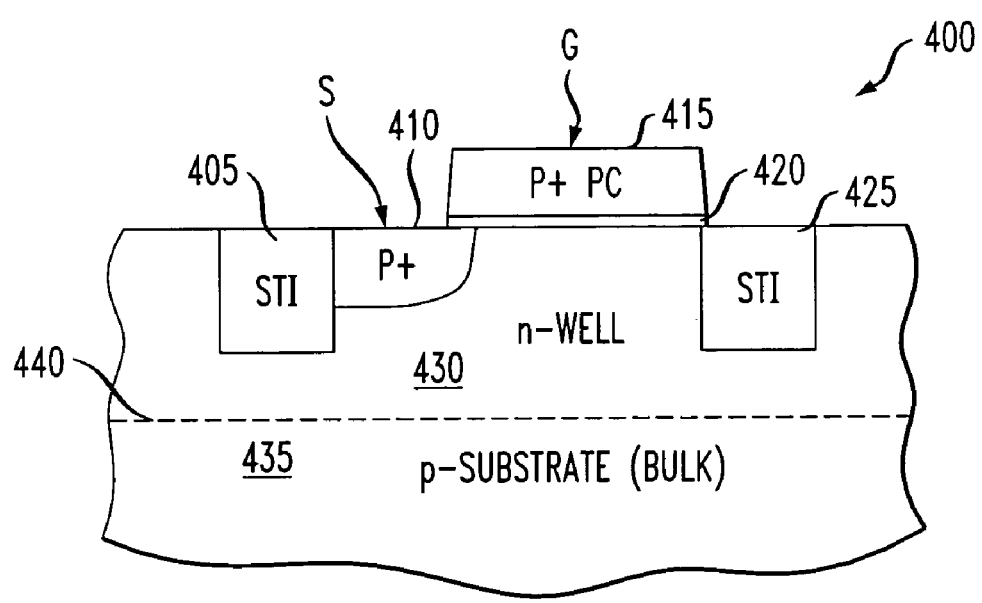
FIG. 4B shows an example of a side view of the first p-type gated diode formed in a semiconductor.

FIG. 4A shows exemplary symbols used for a first p-type gated diode. Symbol 490 is an exemplary symbol for a first p-type gated diode shown in FIG. 4B. The same symbol 490 is used for both FIGS. 4A and 5A. FIG. 4B shows an example of a side view of the first p-type gated diode 400 formed in a semiconductor. The first p-type gated diode 400 comprises a gate insulator 420 formed between a gate 415 (e.g., P+ doped polysilicon) and an n-well 430, a source diffusion region 410, two STI regions 405 and 425, and a p-substrate 435. The dopant concentration in n-well 430 substantially controls the threshold voltage of the gated diode 400.

Figure 5A:
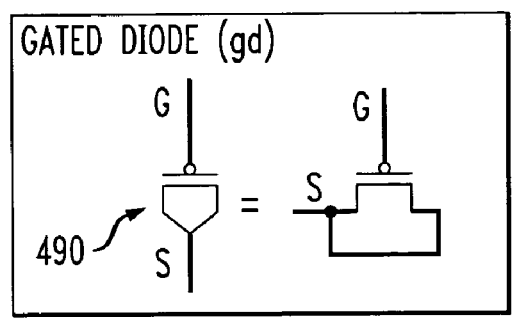
FIG. 5A shows exemplary symbols used for a second p-type gated diode.
Figure 5B:
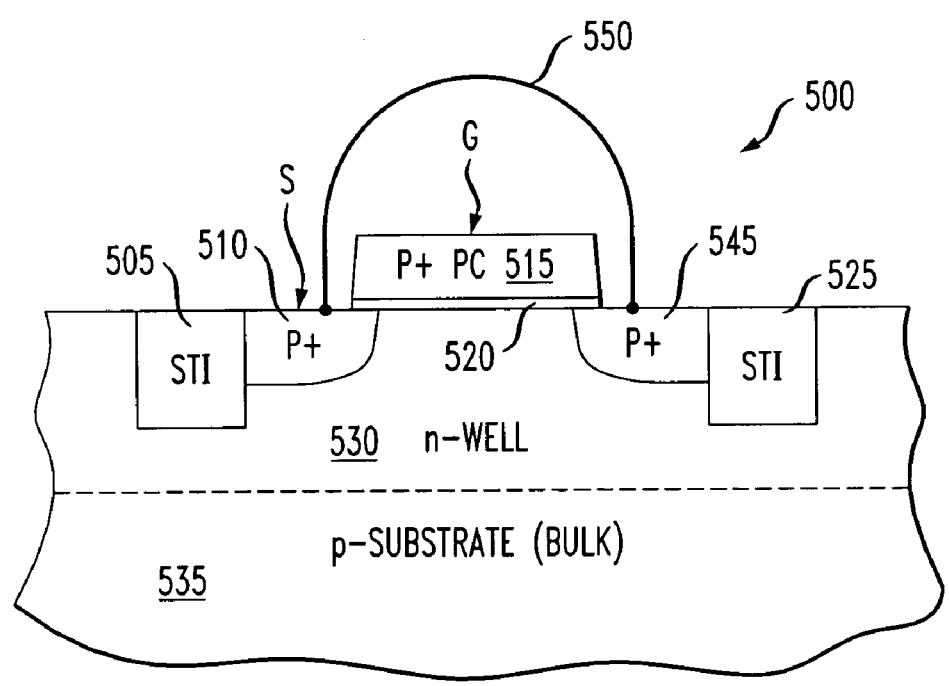
FIG. 5B shows an example of a side view of the second p-type gated diode formed in a semiconductor.

FIG. 5A shows exemplary symbols used for a second p-type gated diode. Symbol 490 is an exemplary symbol for a second p-type gated diode shown in FIG. 5B. FIG. 5B shows an example of a side view of the second p-type gated diode 500 formed in a semiconductor. The second p-type gated diode 500 comprises a gate insulator 520 formed between a gate 515 (e.g., P+ doped polysilicon) and an n-well 530, a source diffusion region 510, two STI regions 505 and 525, a p-substrate 535, a "drain" diffusion region 545, and an interconnect 550 that electrically couples source diffusion region 510 and "drain" diffusion region 545. The dopant concentration in n-well 530 substantially controls the threshold voltage of the gated diode 500.

Figure 6:
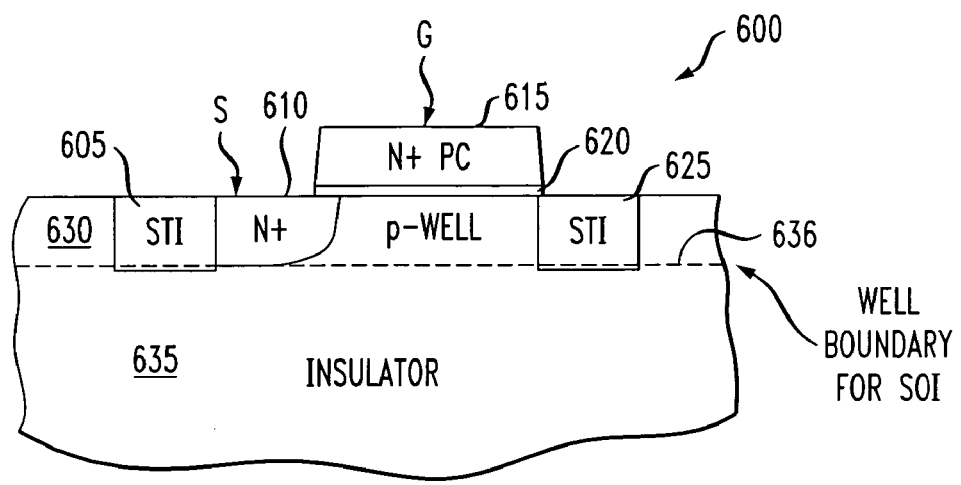
FIG. 6 shows an example of a side view of the first n-type gated diode formed in Silicon-On-Insulator (SOI)

FIG. 6 shows an example of a side view of a first n-type gated diode 600 formed in SOI. The first n-type gated diode 600 comprises a gate insulator 620 formed between a gate 615 (e.g., N+ doped polysilicon) and a p-well 630, a source diffusion region 610, two STI regions 605 and 625, and an insulator 635. The p-well 630 is formed above well boundary 636. The dopant concentration in p-well 630 substantially controls the threshold voltage of the gated diode 600.

Figure 7:
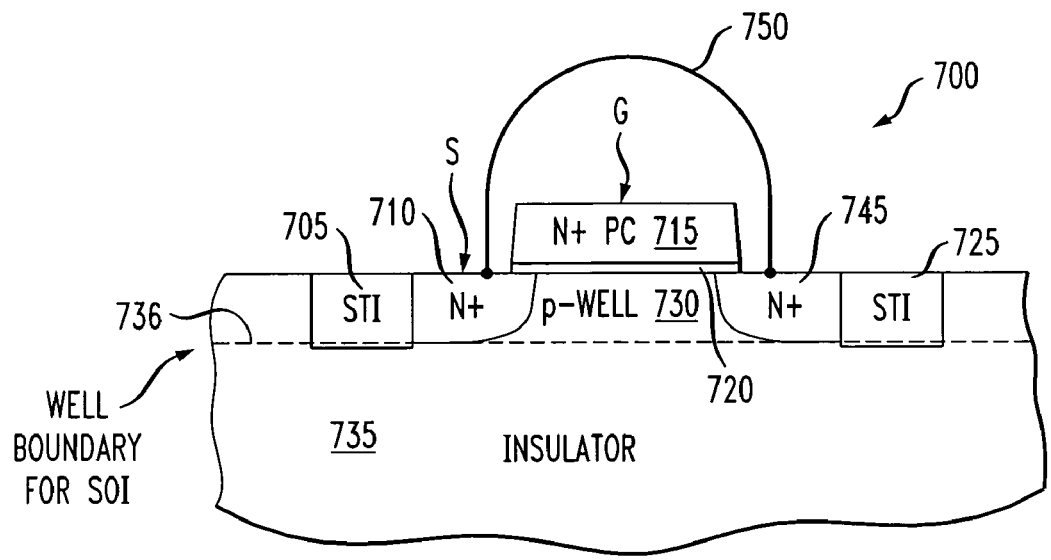
FIG. 7 shows an example of a side view of the second n-type gated diode formed in SOI.

FIG. 7 shows an example of a side view of a second n-type gated diode 700 formed in SOI. The second n-type gated diode 700 comprises a gate insulator 720 formed between a gate 715 (e.g., N+ doped polysilicon) and a p-well 730, a source diffusion region 710, two STI regions 705 and 725, an insulator 735, a "drain" diffusion region 745, and an interconnect 750 that electrically couples source diffusion region 710 and "drain" diffusion region 745. The p-well 730 is formed above well boundary 736. The dopant concentration in p-well 730 substantially controls the threshold voltage of the gated diode 500.

Figure 8:
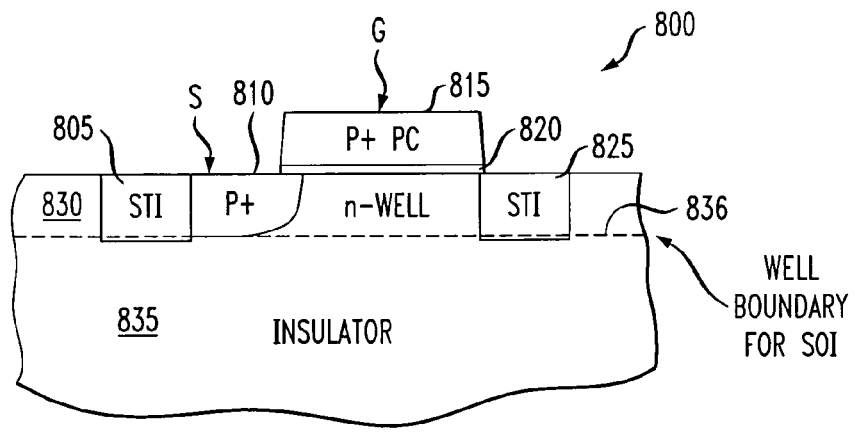
FIG. 8 shows an example of a side view of the first p-type gated diode formed in Silicon-On-Insulator (SOI)

FIG. 8 shows an example of a side view of a first p-type gated diode 800 formed in SOI. The first p-type gated diode 800 comprises a gate insulator 820 formed between a gate 815 (e.g., P+ doped polysilicon) and an n-well 830, a source diffusion region 810, two STI regions 805 and 825, and an insulator 835. The n-well 830 is formed above well boundary 836. The dopant concentration in n-well 830 substantially controls the threshold voltage of the gated diode 800.

Figure 9:
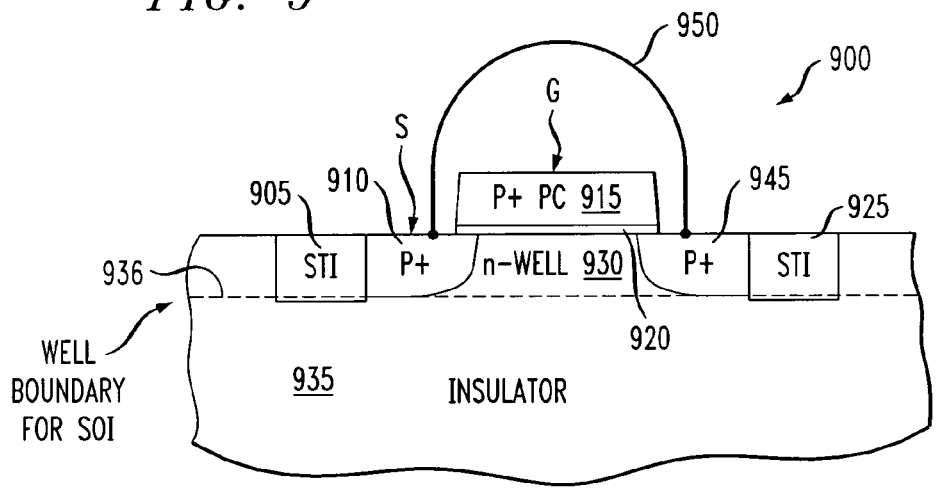
FIG. 9 shows an example of a side view of the second p-type gated diode formed in SOI.

FIG. 9 shows an example of a side view of a second p-type gated diode 900 formed in SOI. The second p-type gated diode 900 comprises a gate insulator 920 formed between a gate 915 (e.g., P+ doped polysilicon) and an n-well 930, a source diffusion region 910, two STI regions 905 and 925, an insulator 935, a "drain" diffusion region 945, and an interconnect 950 that electrically couples source diffusion region 910 and "drain" diffusion region 945. The p-well 930 is formed above well boundary 936. The dopant concentration in p-well 930 substantially controls the threshold voltage of the gated diode 900.

Gated Diode Circuits

The present disclosure describes memory cells using gated diodes. In order to understand the operation of the gated diode in the memory cells, a gated diode circuit is shown and analyzed in this section.

A memory cell using a gated diode has signal amplification that makes use of the charges stored in the inversion layer (e.g., inversion layer 126/226) of the gate channel. As described above, when a small voltage signal corresponding to a high voltage (e.g., data one) is present at the gate of the gated diode, and the voltage at the gate is higher than the threshold voltage of the gated diode, charge is stored in the gate (via an inversion layer underneath the gate, for instance). When signal corresponding to a low voltage (e.g., data zero) is present at the gate, and the voltage is lower than the threshold voltage of the gated diode, very little or no charge is stored in the gate.

Figure 11A:
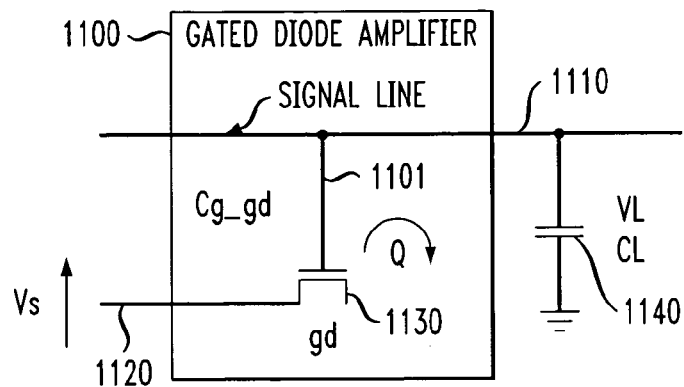
FIG. 11A shows an example of a gated diode circuit.

Turning briefly to FIG. 11A, a gated diode circuit 1100 is shown. Gated diode circuit 1100 is coupled to a signal line 1110, and has a gated diode 1130 whose gate input (and therefore gate) is coupled to the signal line 1110 and whose source input (and therefore source diffusion region) is coupled to a control line 1120. The signal line 1110 has a capacitance 1140 of CL, which is the lumped capacitance from the signal line 1110, coupling capacitance at the gate, and the total capacitance of the connecting circuits (if there is any capacitance) to the signal line. The capacitive load (CL) is not considered part of the gated diode circuit 1110. As shown in FIG. 11A, the signal line 1110 is connected to the gate of the gated diode 1130. The source of the gated diode 1130 is connected to a control line 1120, normally at ground (GND) for an n-type gated diode, or supply voltage (VDD) for a p-type gated diode.

During signal amplification by a gated diode, the voltage (Vs) on the control line is typically boosted. Following the control line voltage, the source voltage (e.g., at the source diffusion region) of the gated diode is also therefore boosted, higher for n-type or lower for p-type, by certain amount (denoted by VB), typically 50 percent to 100 percent of the supply voltage (VDD).

Figure 10:
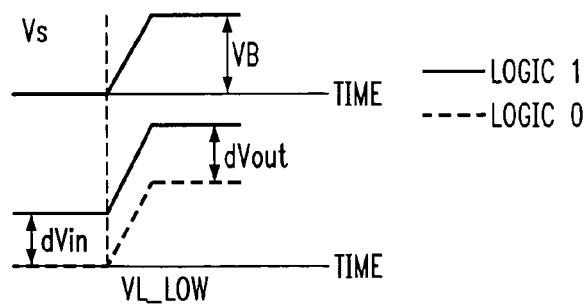
FIG. 10 illustrates a graph of gain for a circuit when a capacitor is used as a charge storage and transfer device.

Turning now to FIG. 10, a graph is shown of gain for an amplifier when a capacitor is used as a charge storage device in the amplifier 1110. In other words, the gated diode 1130 of FIG. 1A is replaced by a conventional or linear capacitor (i.e., a capacitor whose capacitance stays constant with voltage). The first graph, Vs shows how the voltage on the control line 1120 varies. The second graph shows how point 1101 would vary. As seen in FIG. 10, the gain is about one for circuit 1100 when a capacitor is used in place of gated diode 1130. If the signal line 1110 has a high voltage, the output will be VB plus the high voltage (data one). If the signal line 1110 has a low voltage, the output will be VB plus the low voltage (data zero). The difference, dVin, is whatever difference exists between the data one and data zero voltages. Thus, the gain, which is dVout divided by dVin (the data one voltage minus the data zero voltage) is about one. That is, a "gain" of one means there is no voltage gain.

Referring back to FIG. 11A, during signal amplification, the gate voltage is boosted, up for n-type or down for p-type, by an amount close to the source voltage boost, minus some amount, depending on the total capacitance CL, which is the sum of total stray capacitance at the gate coupling to the neighboring devices, capacitance of the line and the total capacitance of the connecting circuits (if there are any). The actual amount of the resulting boost voltage output (e.g., the output on signal line 1110) may be calculated.

Figure 11B:
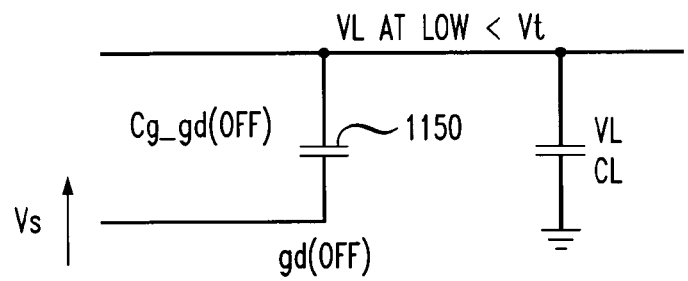
FIG. 11B shows a representative circuit for the gated diode circuit of FIG. 11A when the gated diode is turned off.

If the signal at the gate is a data zero, since there is no or very little charge stored in the gate (e.g., at location 1101) and the gate of the gated diode 1130 is OFF (gate to source voltage (Vgs) below threshold voltage), there is little voltage increase at the gate of the gated diode when detecting a data zero, and the output voltage VL stays at zero or is a substantially small voltage. This is shown in FIG. 11B, where the gated diode 1130 has a very small capacitance, illustrated by reference 1150. Even though Vs might be raised, the resultant output voltage on the signal line 1110 will be low. In other words, the voltage transfer between the control line 1120 and the gate (e.g., point 1101) will be small.

Figure 11C:
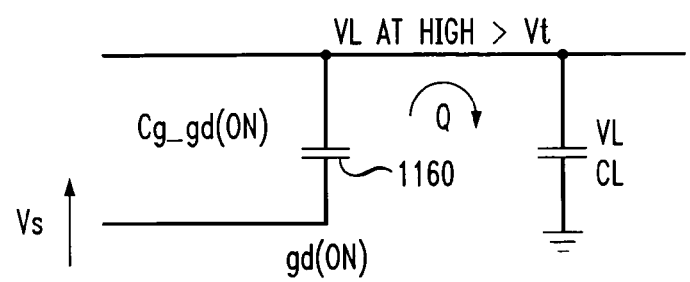

On the other hand, if the signal (voltage measured from GND for n-type or from VDD for p-type) at the gate has been a data one, which is above the threshold voltage of the gated diode. The gated diode is ON and a substantial amount of charge is stored in the gated diode inversion layer initially. As the Vs is raised, the gated diode 1130 becomes less biased or turned OFF, and the charge in the inversion layer is transferred into all the capacitors (CL) connected to the gate, including stray capacitance, line capacitance, and the capacitance of neighboring devices, such as the gates of an inverter or a buffer or switch. Also, the source and gate can act as a capacitor. When the total capacitance (CL) is within certain range compared to the ON capacitance (Cg_gd(ON)) of the gate diode (shown in FIG. 11C), a large voltage increase results at the gate of the gated diode 1130. Thus, as shown in FIG. 11C, the gated diode can be viewed as a large capacitor, as illustrated by reference 1160 when VL is greater than Vt. In other words, the voltage transfer between the control line 1120 and the gate (e.g., point 1101) will be large.

Figure 12A:
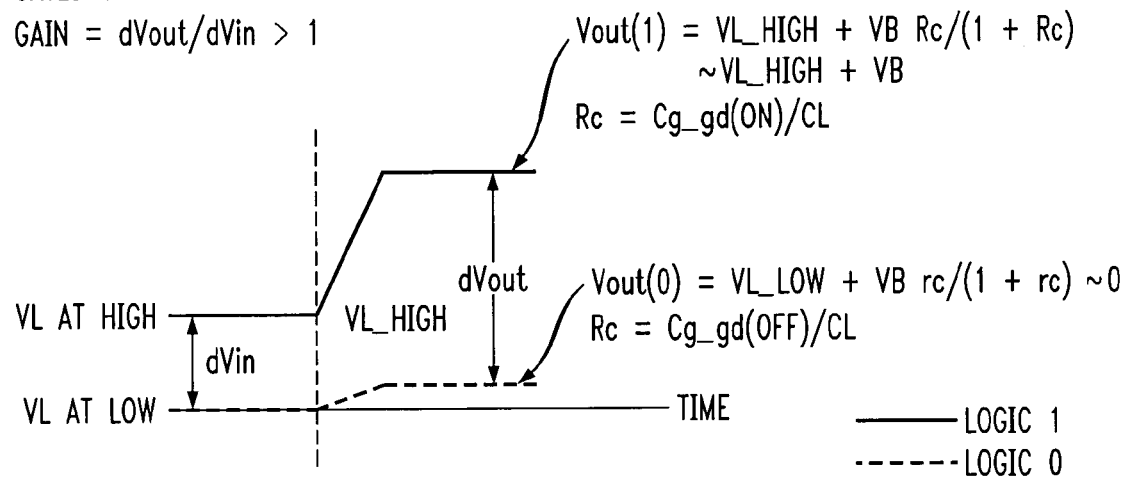
FIG. 12A illustrates a graph of gain for an amplifier when a gated diode is used as the charge storage and transfer device.

This results in a large voltage difference, typically 50 to 150 percent of VDD, at the gate of the gated diode, between signals of data one and data zero. This is shown in FIG. 12A, where dVout is a a large value. Depending on the amplitude of the signal and the boosting voltage (VB), ratio of the load capacitance (CL) to gated diode ON capacitance, the gain achieved varies and can be calculated and characterized over the entire range of the load (CL) for a given gated diode. Typically, a gated diode amplifier 1100 achieves a voltage gain of 2–10 during signal amplification. The output of the gated diode 1130 is by itself a full CMOS voltage swing and can drive a typical small inverter buffer or a latch.

The following analysis illustrates typical values for a gated diode amplifier as shown in FIG. 11A. Let Cg_gd(ON) and Cg_gd(OFF) be the gate capacitance of the gated diode when it is ON and OFF, respectively. Then:

$Rc=Cg\_gd(ON)/CL$, and $rc=Cg\_gd(OFF)/CL$.

For typical operation, the value of the load capacitance (CL) is smaller than or of the same order of magnitude of the ON capacitance of the gated diode (Cg_gd(ON)), but CL is much bigger than the OFF capacitance of the gated diode (Cg_gd(OFF)):

$Cg\_gd(ON) > CL \gg Cg\_gd(OFF)$.

For example, $Cg\_gd(OFF):CL:Cg\_gd(ON)=1:10:20$, and $Rc=2, rc=0.1$.

First consider a logic one signal above the threshold voltage, where the gated diode is ON.

Let VL_HIGH be the logic one voltage, and VL_LOW be the logic zero voltage, typically zero (or ground) for n-type gated diode.

When the control line Vs is boosted by a voltage of magnitude VB, the output voltage at the gate is the following:

$$Vout(1) = VL\_HIGH + VB\,Rc/(1+Rc)$$

$$\sim VL\_HIGH + VB, \quad \text{where}\,(Rc \gg 1);$$

$$Vout(0) = VL\_LOW + VB\,rc/(1+rc)$$

$$\sim VL\_LOW, \quad \text{where}\,(rc \ll 1).$$

Let dVin be the difference of the gate voltage between 0 and 1 before Vs is raised, dVout be the difference of the gate voltage between 0 and 1 after Vs is raised. The output difference dVout is the following:

$dVout=VL\_HIGH+VB\,Rc/(1+Rc)-(VB\,rc/(1+rc)+VL\_LOW)$.

The input difference dVin is the following:

$dVin=VL\_HIGH-VL\_LOW$.

With VL_LOW=0, the gain is the following:

$$\text{Gain} = d V\text{out}/d V\text{in} \sim 1 + (VB/VL\_HIGH) Rc/(1+Rc) > 1.$$

Consider the following example,

Example 1, where VB=0.8 V, VL_HIGH=0.2 V, VL_LOW=0.

Then:

Gain=5 using Gated Diode, and

Gain=1 using linear capacitor.

Consider another example,

Example 2, where VB=0.8 V, VL_HIGH=0.1 V, VL_LOW=0.

Then:

Gain=9 using Gated Diode, and

Gain=1 using linear capacitor.

For cases where Rc is small (<1), it can be shown that the gain of the gated diode signal amplification is given by $$\text{Gain} = 1 + Rc - (Vt\_gd/VL\_HIGH) Rc \sim 1 + Rc,$$

where Vt_gd is the threshold voltage of the gated diode.

Figure 12B:
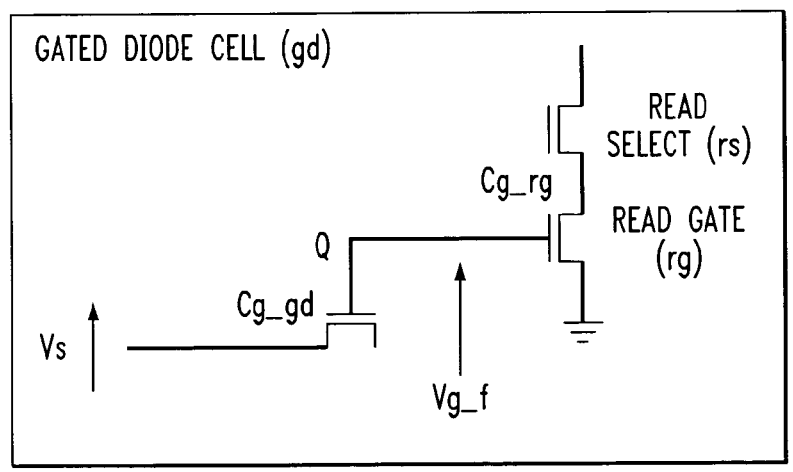
FIG. 12B shows an example of a gated diode memory cell used for FIGS. 12C and 12D.
Figure 12C:
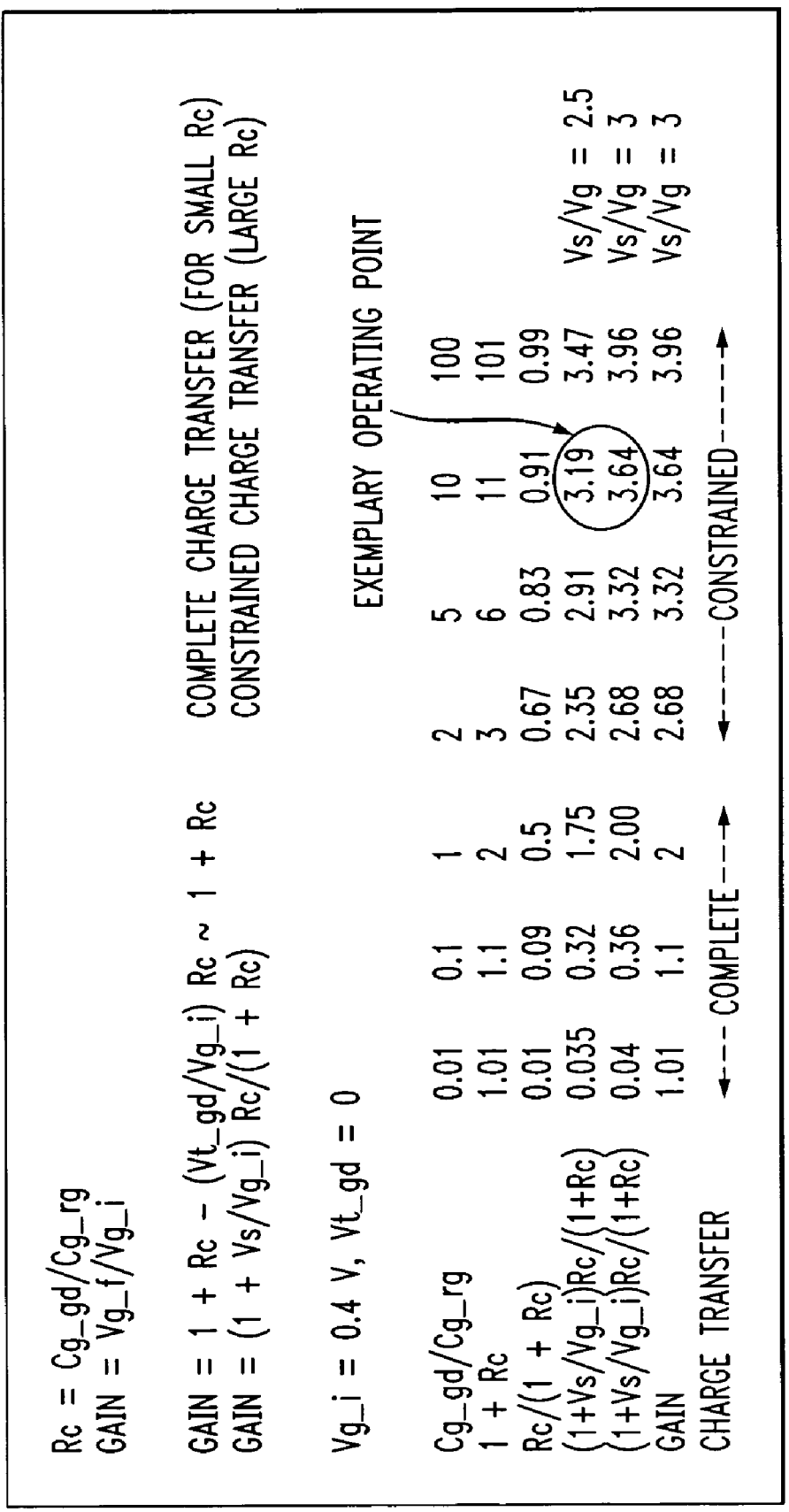
FIG. 12C is a table illustrating complete and constrained charge transfer for the gated diode memory cell of FIG. 12B.
Figure 12D:
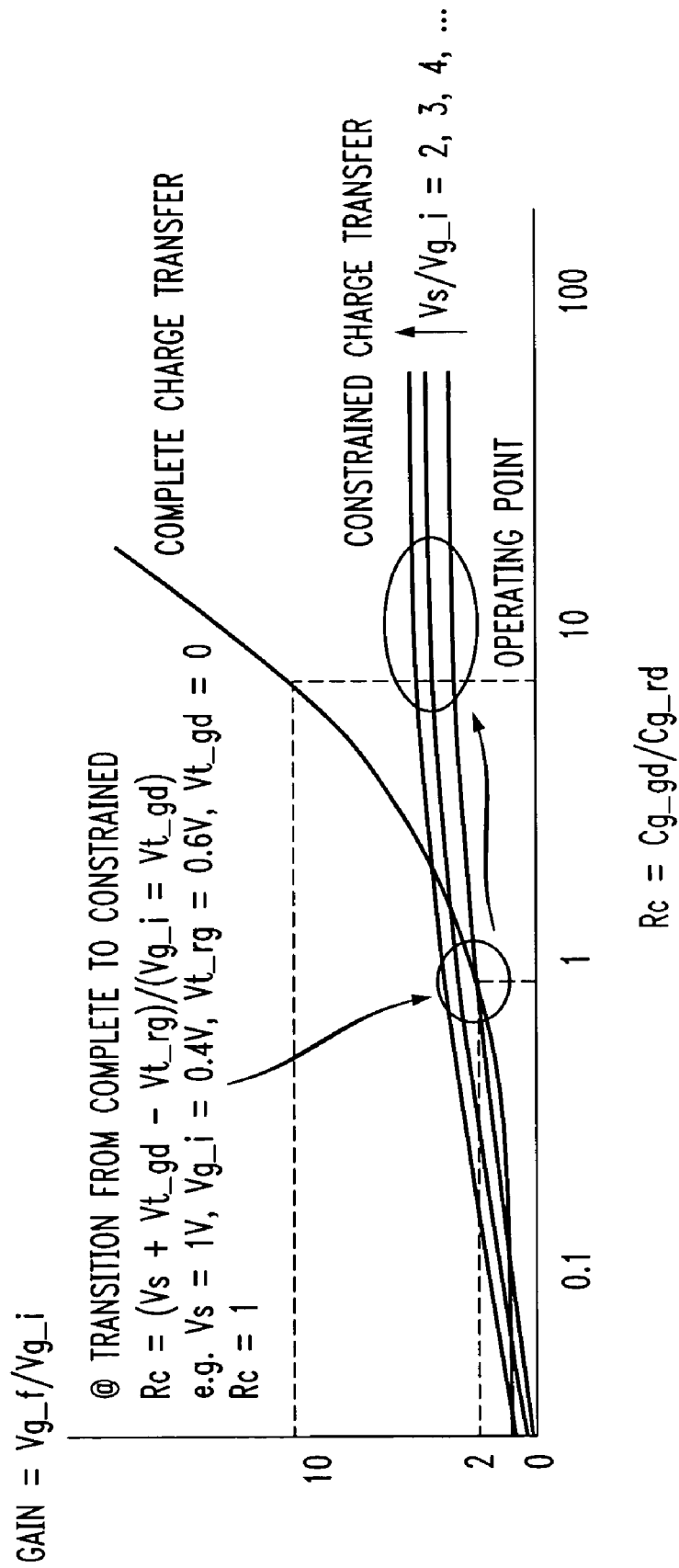
FIG. 12D is a graph showing how the gain of a gated diode memory cell varies with its capacitive load (CL), specifically the capacitance ratio Rc=Cg_gd(ON)/CL, where Cg_gd(ON) is the gated diode ON capacitance.

FIG. 12B shows an exemplary gated diode memory cell and the voltages to be used in FIGS. 12C and 12D. In FIG. 12B, the Vg_f is the final voltage at the gate of the gated diode. It should be noted that Vg_i is the initial voltage at the gate of the gated diode.

FIG. 12C shows a table illustrating complete and constrained charge transfer regions for the gated diode memory cell of FIG. 12B. Complete charge transfer means that the gated diode gives all or very close to all of its charge to the load, CL. Constrained charge transfer means that the gated diode gives only a portion of its charge to the load, CL. FIG. 12D shows the voltage gain of a gated diode under different load ratio Rc, where Rc=Cg_gd(ON)/CL, as defined earlier.

When the signal line has a large capacitive load (CL) larger than the ON capacitance of the gated diode, the gain of the basic gated diode amplifier begins to drop, and eventually the gain becomes 1 (i.e., no gain). Further, the high capacitive load will slow down the amplifier.

For example, the following table shows the gain under different ratio of the gated diode ON capacitance (Cg_gd (ON)) to load capacitance (CL). Assume the following:

VB=0.8 V,

VL_HIGH=0.2 V,

VL_LOW=0, and rc=0.1.

The table is then:

| Rc | 10 | 1 | 0.5 | 0.2 | 0.1 | 0.01 |
|---|---|---|---|---|---|---|
| dVout | 0.93 | 0.6 | 0.47 | 0.33 | 0.27 | 0.21 |
| dVin | 0.2 | 0.2 | 0.2 | 0.2 | 0.2 | 0.2 |
| Gain | 4.6 | 3 | 2.3 | 1.7 | 1.35 | 1.05 | where Rc = Cg_gd(ON)/CL,
dVout = VL_HIGH + VB Rc/(1 + Rc),
dVin = VL_HIGH, and
Gain = dVout/dVin.

Additional details on the gated diode circuit of FIG. 11A can be found in Luk et al., entitled AMPLIFIERS USING GATED DIODES, U.S. patent Ser. No. 10/751,714, filed on the same day as the present application, the disclosure of which is hereby incorporated by reference.

3T1D Memory Cells

A three transistor (T), one diode (D) gated diode memory cell (3T1D) comprises of one gated diode and three FETs. One FET is used to write a data value into the memory cell and the other FETs serve as the write gate and read gate, each of which connects to a write bitline or a read bitline for two port operation. The two bitlines can be combined to a single bitline shared for read and write. The gated diode memory cells and silicon structures are applicable to future generations of silicon technology, operating at low bitline voltage (e.g., 0.3–1.0 Volts) in bulk silicon, SOI, and dual gate finFET.

Figure 13:
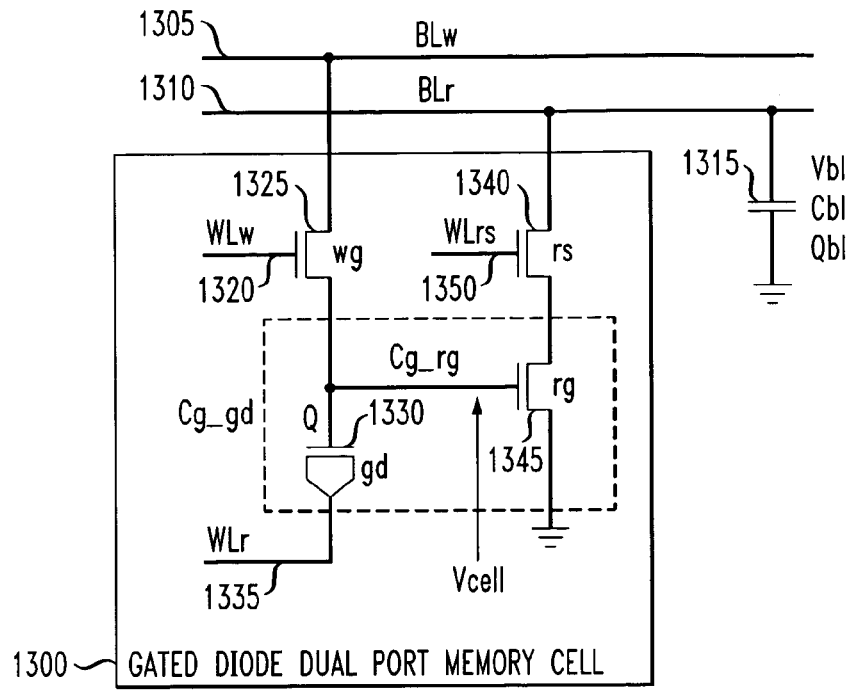
FIG. 13 is a diagram of a gated diode dual port memory cell.

FIG. 13 shows a 3T1D memory cell 1300, in this case a dual port memory cell. The 3T1D memory cell 1300 comprises a gated diode (gd) 1330, and three FETs, namely, a write gate (wg) FET 1325, a read gate (rg) FET 1345 and a read select (rs) FET 1340. The 3T1D memory cell 1300 is coupled to a write bitline (BLw) 1305, a read bitline (BLr) 1310, a read wordline (WLr) 1335, and a write wordline 1320, and the read bitline 1301 has a capacitance Cbl 1315. In this example, the gate of the gated diode 1330 is the storage node and charges are stored in the inversion layer after high voltage corresponding to data one is applied. Illustratively, there is no charge stored if data zero is applied. The source of the gated diode 1330 connects to the read wordline (WLr) 1335 for voltage boosting during the write or read operations. Details about the method of voltage boosting of the gated diode during read and write operations to amplify the cell voltage is detailed below, and boosting is important for the signal enhancement and operations of the 3T1D gated diode memory cell 1300. It should be noted that the FET 1325, 1340 and 1345 act as switches. For the write FET (wg) 1325, the gate connects to a write wordline (WLw) 1320, the drain connects to a bitline (BLw) 1305 and the source connects to the gate of the gated diode 1330. When the write wordline (WLw) 1320 is HIGH, the cell is selected and the storage node (e.g., the gate of the gated diode 1330) is written with the bitline voltage. For the read gate FET (rg) 1345, the gate connects to the storage node to read the data zero or data one stored. The read select FET (rs) 1340 is enabled by the read wordline (WLrs) 1350 during a read operation, connecting the drain of the read gate (rg) 1345 to the read bitline (BLr) 1310, to sense the voltage of the storage node (e.g., Vcell).

In some situations, both WLr 1335 and WLrs 1350 can be the same control signal. The raising of the gate diode source voltage can be used to enable the read select FET 1340, in the read boosting mode of operation detailed later. But in general, one may want to put a negative voltage on the gate of the read select FETs 1340 that are not selected to reduce sub-threshold leakage current, and this may require WLrs 1350 to be different than WLr 1335. Running more than one wordline, such as WLw 1320, WLrs 1350 and WLr 1335 is feasible since that direction of wiring is not as limited as the bitline direction. Using separate wordlines also reduces the heavy loading by spreading out the loads.

In FIG. 13, the 3T1D gated diode memory cell 1300 has two ports, one for read and one for write. The read wordline (WLr) 1335 connects to the source of the gated diode 1330. Another wordline (WLrs) 1350 connects to the gate of the read select FET (rs) 1340, to enable the read operation and also the voltage boosting of the storage cell during read. The storage cell voltage can be boosted much higher than the voltage stored.

In FIG. 13, WLr can be an extra write wordline (WLw2) (i.e., WLr is named WLw2 and WLw2 is not connected to WLrs 1350) that is connected to the source of the gated diode 1330. This arrangement supports a write boosting operation, where the write wordline (WLw2) is used during the write operation to boost the voltage at the storage node, to much higher than the bitline high voltage (VBLH). The bitline high voltage (VBLH) corresponds to the voltage for writing a data one to a memory cell. Additionally, in this configuration (as explained in more detail in reference to FIG. 24 below), the WLrs 1350 is typically implemented as a separate control line to the read select FET 1340.

Figure 14:
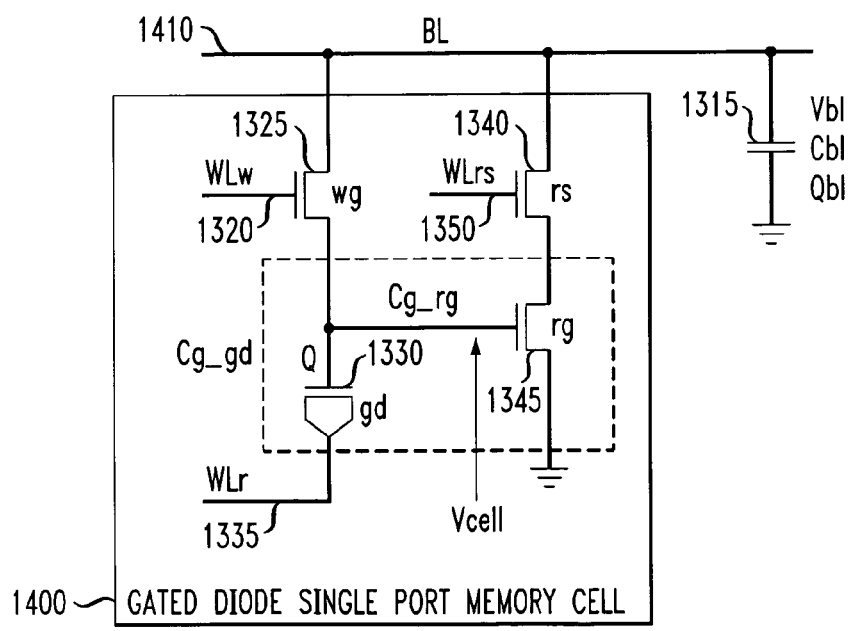
FIG. 14 is a diagram of gated diode single port memory cell.

FIG. 14 shows a 3T1D gated diode memory cell 1400 with single port where the read and write bitlines are shared via a single bitline 1410.

Figure 15:
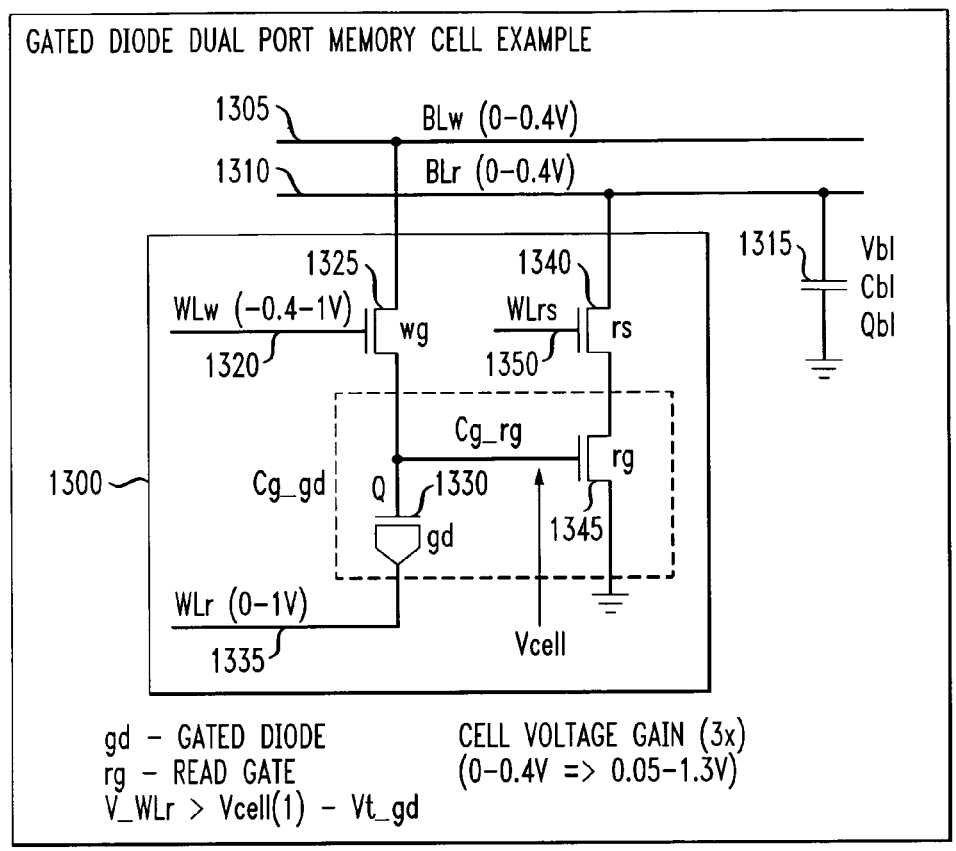
FIG. 15 is a diagram of the gated diode dual port memory cell of FIG. 13, used for an example.

Exemplary voltages of the memory cell, wordlines and bitlines of the 3T1D gated diode memory cell 1300, for one exemplary manufacturing technique, are shown in FIG. 15. The bitline voltages are less than the supply voltage (VDD) of the technology, but due to the intrinsic gain of the gated diode memory cell enabled by the voltage boosting method for read and write operations, the memory cell operates at a signal voltage higher than the bitline voltage during read and write operations, providing better signal to noise margin. Typical bitline voltage is 50% of supply voltage (VDD), resulting in substantial active power saving, compared to conventional DRAM and SRAM.

Voltage Boosting and Voltage Gain

Next, an analysis shows that the gated diode 1330 can be written with a small voltage, from a bitline via the write gate (wg) 1325, and then can be amplified to typically 2–3 times by raising voltage (called "boosting" voltage) at the source of the gated diode. The signal amplification can be done either during the write operation or during the read operation, as follows:

Write boosting: If the original data one voltage is amplified by voltage boosting during the write cycle, the higher boosted voltage at the gate of the gated diode 1330 is stored in the gated diode 1330 after the write operation, for subsequent read, by the read gate (rg) 1345. The higher amplified gate voltage results in higher signal margin and more gate overdrive for the read gate 1345 during the read operation. For data zero, there is little signal amplification or voltage boosting, and gate voltage remains almost zero.

Read boosting: If the original data one lower voltage is stored in the gated diode 1330 during the write operation, it is then boosted higher during the read operation. This results in signal amplification and voltage gain of the original data one signal, hence higher signal margin and more gate overdrive for the read gate 1345 during the read operation. For data zero, there is little signal amplification from voltage boosting, and gate voltage remains almost zero.

The boosting of the gated diode memory cell 1300 voltage, either by write or by read, greatly enhances the signal to noise margin of the memory cell 1300, and separation margin between a data zero and a data one below or above the threshold for the read gate 1345. This is especially important for future generation of technology, since the margins are getting very small due to threshold voltage variation and mismatch, if small signals are used. Higher external signal voltage can be applied (e.g., via bitline voltage) but that requires more active power. This 3T1D memory cell 1300 does not require high bitline voltage to create high cell signal voltage for better signal to noise margin; instead, the higher signal voltage is created during either the write or read operation by the gated diode voltage boosting.

In a gated diode memory cell 1300, let:

Cg_gd(ON) and Cg_gd(OFF) be the gate capacitance of the gated diode when it is ON and OFF respectively.

CL be the total load capacitance connected to the gate of the gated diode (gd), where CL is typically made up of the gate capacitance of the read gate (rg) 1345, and the stray capacitance at the gate of the gated diode 1330 to the neighbors.

Then:

$$Rc = Cg\_gd(ON)/CL, \quad (1)$$

$$rc = Cg\_gd(OFF)/CL.$$

A typical setting is that the load capacitance (CL) is smaller than the ON capacitance of the gated diode (Cg_gd (ON)). However, the CL is much bigger than the OFF capacitance of the gated diode (Cg_gd(OFF)):

$$Cg\_gd(ON) > CL \gg Cg\_gd(OFF).$$

For example, $$Cg\_gd(OFF) : CL : Cg\_gd(ON) = 1:10:20, \text{ or}$$

$$Rc = 2, rc = 0.1.$$

Let $Cg\_gd(ON) > CL$, $$Vt\_gd = 0,$$

$$Vt\_rd = 0.2 \text{ V},$$

$$Vcell\_i = 0.4 \text{ V (initial cell voltage)},$$

$$VB = 0.8 \text{ V (boosting voltage magnitude, } Vs = 0 \to 0.8 \text{ V), and}$$

the charge stored in the gated diode is given by $$Q\_stored = (Vcell\_i - Vt\_gd)Cg\_gd.$$

When the voltage at the source of the gate diode is raised, some charge from the gated diode inversion layer is transferred to the load CL. The final gate voltage Vcell_f is then:

$$Vcell\_f > VB + Vt\_gd, \quad (2)$$

The charge to charge up $CL$ up to $VB + Vt\_gd$ is given by $$Q\_transfer1 = (VB + Vt\_gd - Vt\_rg)CL.$$

The charge to charge up both $Cg\_gd + CL$, above $VB + Vt\_gd$ is given by $$\begin{aligned} Q\_transfer2 &= Q\_stored - Q\_transfer1 \\ &= (Vcell\_i - Vt\_gd)Cg\_gd - (VB + Vt\_gd - Vt\_rg)CL, \\ &= Vcell\_i\ Cg\_gd - VB\ CL + Vt\_rg\ CL - Vt\_gd(Cg\_gd + CL), \end{aligned}$$

$$del\_V1 = VB + Vt\_gd - Vt\_rg,$$

$$\begin{aligned} del\_V2 &= Q\_transfer2/(Cg\_gd + CL), \\ &= [(Vcell\_i - Vt\_gd)Cg\_gd - (VB + Vt\_gd - Vt\_rg)CL]/(Cg\_gd + CL), \\ &= Vcell\_i\ Rc/(1 + Rc) - VB/(1 + Rc) + Vt\_rg/(1 + Rc) - Vt\_gd, \end{aligned}$$

$$Vcell\_f = Vt\_rg + del\_V1 + del\_V2,$$

$$Vcell\_f = (VB + Vcell\_i)Rc/(1 + Rc) + Vt\_rg/(1 + Rc),$$

$$\text{Gain} = Vcell\_f/Vcell\_i \sim (1 + VB/Vcell\_i)Rc/(1 + Rc), \quad (3)$$

for ($Vcell\_i > Vt\_gd$, $Rc > 1$, for large $Rc$).

It can be shown that $$Gain=1+Rc, \quad (4)$$

for small Rc<1.

Putting in typical values,

Vcell_i=0.4 V (bitline voltage VBLH),

VB=1 V (VDD),

Vt_gd=0,

Vt_rg=0.2 V (Vt of the read gate),

Rc=10.

$Vcell\_f=(1+0.4)(10)/(1+10)+0.2/(1+10)=1.29$ V,

Gain=1.29/0.4=3.23.

The following table shows gain as a function of Rc, Vs, and Vg_i:

| Rc = Cg_gd/CL | 0.01 | 0.1 | 1 | 2 | 5 | 10 | 100 |
|---|---|---|---|---|---|---|---|
| 1 + Rc | 1.01 | 1.1 | 2 | 3 | 6 | 11 | 101 |
| Rc/(1 + Rc) | 0.01 | 0.09 | 0.5 | 0.67 | 0.83 | 0.91 | 0.99 |
| Gain (for VB/Vcell_i = 2.5) | 1.01 | 1.1 | 2 | 2.35 | 2.91 | 3.19 | 3.47 |

Putting in the typical values,

Vcell_i=0.4 V (bitline voltage VBLH),

VB=0.8 V (VDD),

Vt_gd=0,

Vt_rg=0.2 V (RVt read gate),

Rc=10, $Vcell\_f=(0.8+0.4)(10)/(1+10)+0.2/(1+10)=1.11$ V,

Gain=1.11/0.4=2.78,

This is shown in the following table of gain as a function of Rc, Vs, and Vg_i:

| Rc = Cg_gd/CL | 0.01 | 0.1 | 1 | 2 | 5 | 10 | 100 |
|---|---|---|---|---|---|---|---|
| 1 + Rc | 1.01 | 1.1 | 2 | 3 | 6 | 11 | 101 |
| Rc/(1 + Rc) | 0.01 | 0.09 | 0.5 | 0.67 | 0.83 | 0.91 | 0.99 |
| Gain (for VB/Vcell_i = 2) | 1.01 | 1.1 | 2 | 2.01 | 2.49 | 2.73 | 2.97 |

When the source voltage is boosted, the gated diode 1330 partially transfers some charge from the storage cell to the adjacent circuit (read gate 1345 in this case), achieving a much larger signal compared to conventional DRAM and gain cells using capacitive cells. The voltage gain is always greater than 1, typically gain can be achieved between 2 to 10 in practice. Indeed a 3T1D memory cell 1300 achieves voltage gain multiple times the initial stored voltage from the bitline, whereas there is no voltage gain in the conventional DRAM and gain cell cases. For a gain cell, the voltage gain is 1, whereas in DRAM, due to charge sharing, charge and voltage in the cell are lost and restored after a read operation is needed. In the present invention, this gain in cell voltage can be applied during either a write operation or a read operation. "Double gains" are achieved in both the storage cell (voltage gain) and the sensing read gate (current gain), compared to only single gain (from the read gate) in conventional gate cells.

Retention Time, Leakage and Capacitance Ratio

To improve retention time of the gated diode memory cell 1300, two main leakage currents should be addressed:

The sub-threshold voltage current through the source of write gate 1320 connecting to the gate of the gated diode 1330; and The leakage current through tunneling at the gate of the gated diode 1330.

The sub-threshold current is minimized by applying a negative voltage on the write wordlines (WLw) 1320, so that all the write gate of the non-selected cells have a negative gate voltage and hence a negative gate to source voltage (Vgs). A higher threshold voltage FET 1325 also reduces the sub-threshold leakage, about 100 mV per decade of threshold voltage.

The tunneling leakage current through the gate may be reduced by using high-K gate dielectric with gate insulation thickness increased. Typical gate oxide thickness of 25 Angstroms should be sufficient to limit the gate tunneling current. As an example, for 90 nanometer (nm) technology and beyond, high-K gate dielectric may be needed to provide sufficient ON capacitance in the gated diode 1330 while maintaining sufficient oxide thickness to keep tunneling current low.

Total capacitance for the gated diode 1330 and read gate 1340, pertaining to the current technology and taking into account future technology scaling, is typically around 1 to 2 femtofarad (fF). Future generation of technology has smaller feature size, but the gate oxide thickness will be scaled smaller, and the end result is that the gate capacitance remains roughly constant. Up to certain point, when gate oxide thickness can no longer be reduced proportionally with scaling, high K dielectric will be an alternative to keep the capacitance value about the same. So the design value of capacitance for the gated diode 1330 can be assumed roughly constant over time. Much lower capacitance values would work also, as long as the ratio of capacitance of gated diode 1330 to the read gate 1345 is observed as given by equations (1), (2), (3) and (4) described earlier. It should be pointed out that higher value of gated diode capacitance has the advantage of stabilizing cell voltage due to leakage and soft errors, but higher value of capacitance requires more cell area. So 2 fF to 8 fF is a good range for the total capacitance for the gated diode and read gate.

If it is desirable to use higher total capacitance for cell voltage stability to improve retention and reduce soft error, it is better to use a lower capacitance ratio Rc, where Rc=Cg_gd/CL. Since the higher the gated diode ON capacitance, the higher the gated diode would require bigger wordline (WLr) driver to drive. In such a case, using a lower capacitance ratio is a good balance between high total capacitance and ease of driving the wordline. Typically, the ON capacitance of the gate diode should be under 4 pF. For writing and reading data zero, since the gated diode 1330 does not store any charge, there is no active current needed to supply to the source and the gate of the gated diode 1330, this is an important advantage of gated diode 1330 for saving active power and minimizing voltage fluctuation on the bitlines and wordlines, since on average, 50 percent of the read and write of the data is zero.

Retention Time and Sub-Threshold Leakage Control for Write Gate

The retention time of the gated diode memory cell 1300 is determined by the total leakage current from the gate of the gated diode 1330 to the silicon body, to the drain through gate tunneling, and the sub-threshold leakage current via the write gate 1325 source-to-drain and drain-to-body. The retention time of a cell (T_retention), which is determined by the time to lose a certain amount of charge in terms of voltage being discharged by the total leakage current (I_leakage) when the cell is storing a high voltage for data one. If retention time is defined as losing an amount V_drop of the high voltage, say, 10 percent of the stored voltage, then:

T_retention = V_drop Cg_gd(ON)/I_leakage.

Typically, if T_retention is set to 10 us (micro-seconds),

V_drop = 0.1 V, Cg_gd(ON) = 2 fF, and:

I_leakage < V_drop Cg_gd(ON)/T_retention

= 0.1 (2e − 15)/10e − 6 = 2e − 11 = 20 pA.

In order to achieve such low leakage current, pertaining to the current state of silicon technology, the threshold voltage of the write gate needed to be around three to four decades higher than a regular threshold voltage device. With a threshold voltage slope of around 100 mV/decade, it is equivalent to putting a negative of around −0.4 to −0.3 V to the gate of the write gate of the non-selected memory cells. Further, in order to have the gate tunneling current under this leakage requirement, gate oxide thickness has to be above 25 A.

Method of Read Operation and Voltage Boosting

When a voltage corresponding to a data one is present at the gate of the gated diode 1330, and the voltage is higher than the threshold voltage of the gated diode 1330, charge is stored in inversion layer of the gate channel. When a voltage corresponding to a data zero is present at the gate, and the voltage is lower than the threshold voltage of the gated diode 1300, no or very little charge is stored in the gate. The capacitance characteristic of a gated diode versus gate to source voltage (Vgs) is shown in FIGS. 3A and 3B. As described above, the capacitance is negligible when Vgs is below the threshold voltage, and increases directly with Vgs when Vgs is above the threshold voltage, and settles at a maximum value above certain values of Vgs. When Vgs is above the threshold voltage, a certain amount of charge is stored in the gated diode, and the gated diode acts as a capacitor. When Vgs is below the threshold voltage, the gated diode 1330 is of negligible capacitance.

Turning back to FIGS. 11A, 11B, and 11C, for a read operation, the read wordline (WLr) 1335 voltage is raised by an amount VB. When the voltage corresponding to data zero is applied to the gate of the gated diode 1330, since the voltage is below the threshold voltage, there is zero or negligible charge stored in the gated diode, and the capacitance across the gated diode 1330 is the gate to source fringe and overlapping capacitance (C_gd(OFF)). This capacitance is very small compared to the ON capacitance (Cg_gd(ON)) and the surrounding stray capacitance (C_stray) at the gate. When WLr is raised, there is only a very slight increase in voltage at the gate of the gated diode because Cg_gd(OFF) is very small and the coupling effect is very small. The data zero coupling effect comes from the voltage divider formed by the gated diode capacitance (e.g., almost zero) and the load capacitance (CL), the capacitance CL being bigger, for example, 10 to one. The capacitance CL is made up of stray capacitance at the gate of the gated diode 1330, and the capacitance of the connecting wires and devices, which in this case is the gate capacitance of the read gate 1345. So the voltage increase at the gate for reading data zero is very small, on the order of VB/10. When data one is stored in the memory cell 1300, there is significant amount of charge (Q_stored) stored in the gated diode 1330 and the capacitance (C_gd(ON)) across the gated diode is large. When the voltage on WLr 1335 is raised, which is the same voltage as the source voltage of the gated diode, the voltage at the gate (Vg_gd) is boosted to:

Vcell_f=VB cc+Vcell_i,cc=Cg_gd/(Cg_gd+CL), where cc is the coupling coefficient of the voltage divider formed by the gated diode capacitance and the load capacitance of the connecting nodes to the gate of the gated diode 1330, Vcell_i is the initial cell voltage (Vcell) at the gate of the gated diode and Vcell_f is the cell voltage (Vcell) after the voltage of WLr 1335 is raised (called "boosting").

For example,

Cg_gd(OFF):CL:Cg_gd(ON)=1:10:100,

VB=0.8 V, VBLH=0.4 V,

The following table shows gated diode voltage gain for reading data zero and data one, where Gain=(1.13−0.08)/(0.4−0)=2.63:

|  | Read data zero | Read data one |
| --- | --- | --- |
| Cg_gd | Cg_gd(OFF) << CL | Cg_gd(ON) >> CL |
| cc | 0.09 | 0.91 |
| Vcell_f | 0.1 VB = 0.08 v | 0.91 VB + VBLH = 1.13 V |

This results in a big voltage difference between reading data zero and data one. Indeed, a voltage gain of about 2.6 occurs in the memory cell 1300 in the example above. If the gated diode is replaced by a capacitor, the read zero and read one voltage would be 0.8 V and 1.2 V respectively, and there is no voltage gain (i.e., gain=1).

Figure 16:
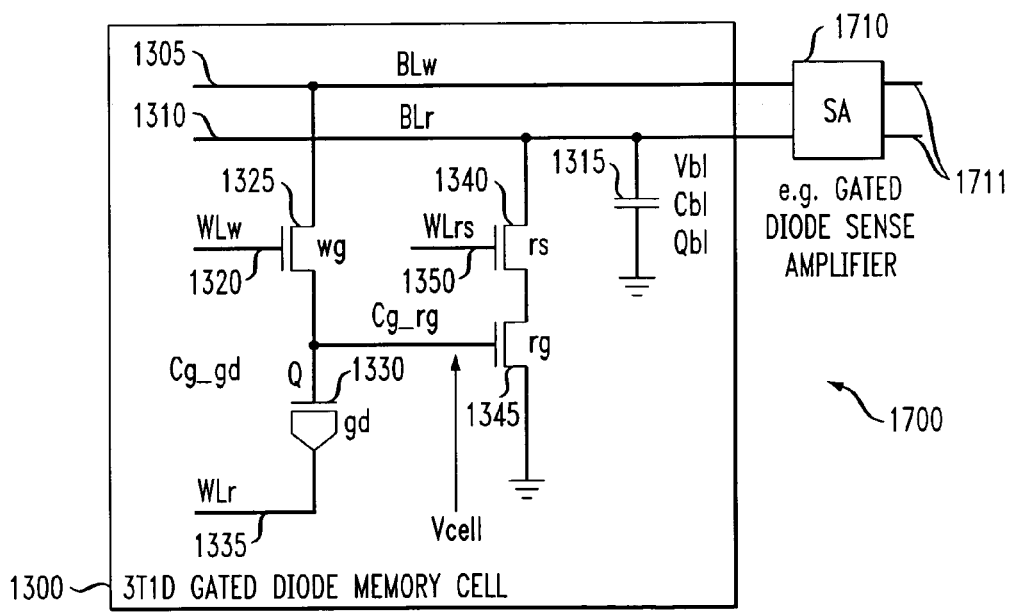
FIG. 16 is a diagram of a memory portion having a gated diode dual port memory cell and a sense amplifier.
Figure 17:
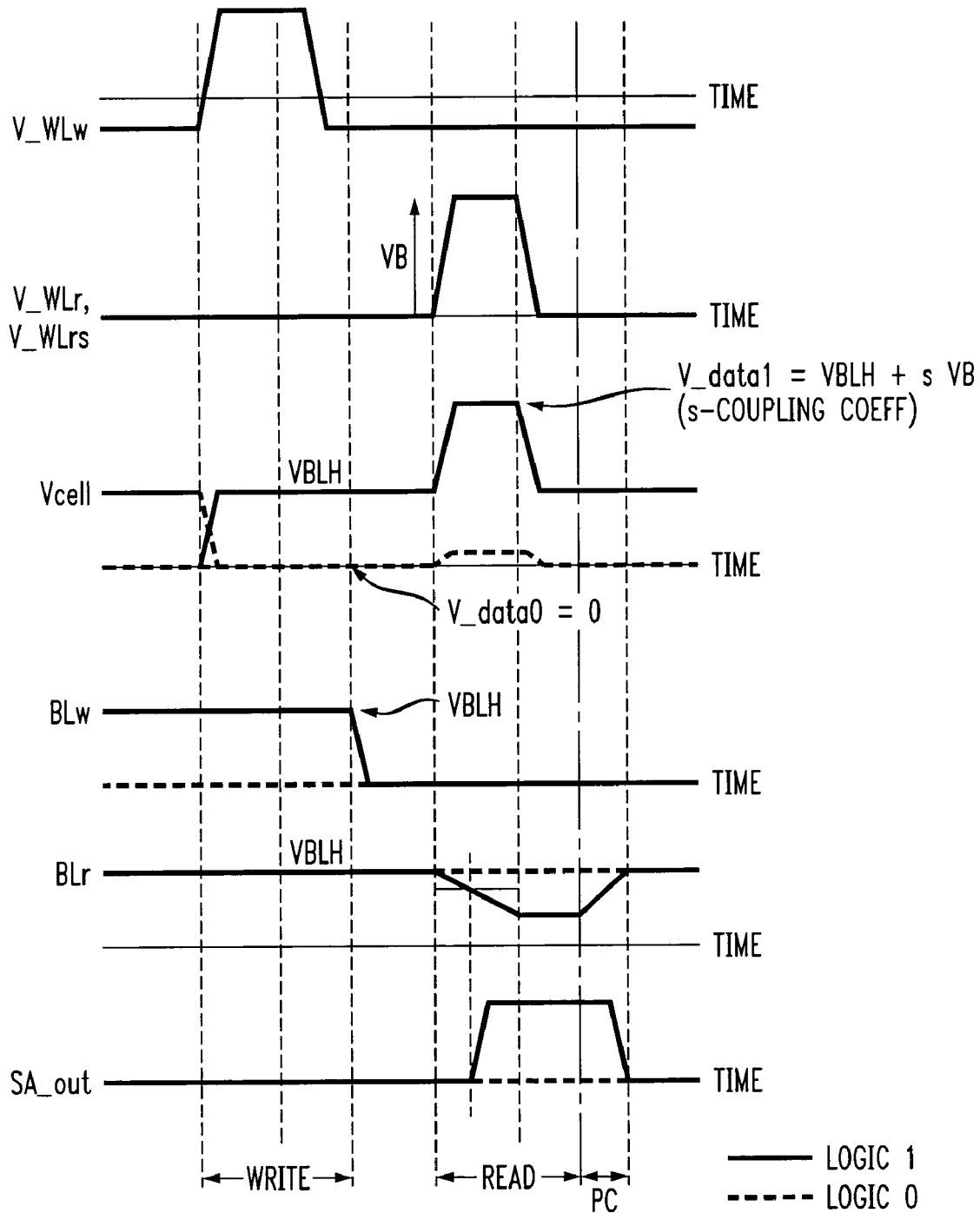
FIG. 17 shows a number of waveforms for the memory portion of FIG. 16 with read boosting.

FIG. 16 shows a memory portion 1700 comprising a 3T1C memory cell 1300 and a sense amplifier unit 1710. The sense amplifier unit 1710 detects and amplifies the signal on the read bitline (Blr) 1310 during a read operation and output to the global bitline 1711. During a write operation, the sense amplifier unit passes the signal on the global bitline 1711 onto the write bitline (Blw) 1305 for subsequent writing into the gated diode storage cell 1330. FIG. 17 shows a number of exemplary waveforms using the memory portion 1700. These figures will be used in the description below.

FIG. 17 illustrates a method having a read operation of a 3T1D memory cell 1300, with voltage boosting to amplify the cell voltage during a read operation. FIG. 16 shows a memory cell 1300 with a n-type gated diode 1330. A two port configuration with read bitline (BLr) 1310 and write bitline (BLw) 1305 is shown, though the method shown in FIG. 17 applies to a memory cell 1300 with single port or with more than two ports also. There are one write wordline (WLw) 1320 and one read wordline (WLr) 1335 connected to the memory cell 1300. The memory cell 1300 is a 3T1D memory cell, which comprises a gated diode (gd) 1330, a read gate (rg) 1345, a write gate (wg) 1325 and a read select FET (rs) 1340, as detailed earlier. The bitlines are connected to a sense amplifier 1710, which is typically external to the memory cells, for input/output. The read wordline 1310 and the write wordline 1305 are driven by wordline drivers (not shown), which are typically external to the memory cells.

The voltage of the write wordline (WLw) 1320 is a control signal to activate a cell 1330 for writing. The voltage of the wordline 1320 is typically between zero volts (V) (e.g., GND) and supply voltage (e.g., VDD), or preferably a negative voltage is used to replace the zero volts to reduce sub-threshold leakage current in those cells that are not selected. When WLw 1320 is high, the cell 1330 that connects to it is activated for writing. The voltage of the read wordline (WLr) 1335 is a control signal connected to the source of the gated diode (gd) 1330 for read operation. The read wordline WLR 1335 is used to boost the voltage on the gated diode 1330 as detailed previously. The voltage on the read wordline is typically between zero volts and VB, the boosting magnitude. The low voltage of WLr 1335 can also be slightly negative to enhance the signal written into the cell to offset the threshold voltage of the gated diode. The voltage of the write bitline (BLw) 1305 is a signal line carrying data zero (typically a low voltage, such as 0 V or gound) or data one (typically a high voltage, such as VBLH) to write to the cell. The voltage of the read bitline (BLr) 1310 is a signal line carrying the signal generated from reading the stored data of the cell. The read bitline 1310 is generally precharged to the bitline high voltage (VBLH) and is connected to a sense amplifier for signal detection and output.

WLr 1335 can be used to control the gate of the read select FET (rs) 1340, to enable the FET 1340 to the bitline 1310 during a read operation. It is also desirable to add another optional control line (WLrs) 1350 to control the gate of the read select FET (rs) 1340, instead of using WLr which controls the source of the gated diode 1330. When WLrs 1350 is high, the memory cell 1300 is coupled to the bitline for read, which is what WLr 1335 does. WLrs 1350 has a negative low voltage to apply to the gate of the FETs 1340 when a row is not selected, and this reduces the active sub-threshold leakage current when the array is active, but that particular row is not selected.

These exemplary method and operations in FIG. 17 involve an n-type gated diode memory cell 1300, and the read bitline is precharged to HIGH (VBLH). The method applies accordingly to p-type gated diode and read bitline precharged to LOW (GND), operating in a complementary fashion. The details of the p-type operation can be determined by those who are skilled in the art.

A read boosting method is described in FIG. 17 to operate the 3T1D memory cell 1300. On the right part of FIG. 17, there are six voltages over time shown to illustrate the operations. The first graph is the voltage of the write wordline (WLw) 1320. The second graph is the voltage of the read wordline (WLr 1335 or WLrs 1350). The third graph is the voltage of the storage cell (Vcell). The fourth graph is the voltage of the write bitline (BLw) 1305. The fifth graph is the voltage of the read bitline (BLr) 1310. The sixth graph is the voltage of the sense amplifier output 1711. Both data zero and data one are shown and the write and read of data zero or data one are illustrated.

First, the (non-boosted) "WRITE" operation is shown. The write wordline is activated to HIGH and data on the write bitline (either a data one or a data zero) is written into the gated diode 1330 via the write gate. For the cells that are not selected, the gates are connected to a negative voltage by other WLw 1320 to reduce sub-threshold leakage current.

For the read wordline WLr 1335, a small negative voltage can be applied, as an option, to a read wordline during write operation. The small negative voltage has the effect of lower the threshold voltage of the gated diodes whose source is connected to the read wordline 1335, to enhance the signal, or charge written into the cells.

Secondly, the "READ" operation is shown. The read wordline (WLr) 1335 connected to the source of the gated diode 1330 is activated. The voltage is raised higher by an amount VB to boost the voltage on the gated diode 1330 as detailed earlier. If the cell 1300 stores a data zero, the cell voltage at the gate of the gated diode 1330 is GND. The cell voltage remains at GND since there is little charge in the gated diode 1330. The cell voltage, being at GND, appears at the gate of the read gate (rg) 1345. The cell voltage is below the threshold voltage of the read gate 1345, so the read gate remains off and there is negligible current through the read gate 1345. The bitline voltage remains unchanged, and stays at high, the precharged voltage (VBLH). If the cell stores a data one, the cell voltage is VBLH before the boosting is applied. After the boosting voltage is applied, the voltage at the gate of the gated diode 1330 rises by an amount "s VB," where s is the coupling coefficient as detailed earlier in the operation of gated diode. This read one signal, of magnitude (VBLH+s VB), achieves a significant voltage gain and turns the read gate (rg) 1345 ON strongly, and since the FET (rs) 1340 is ON, a sufficient large current develops to discharge the bitline 1310. The bitline 1310 voltage goes towards ground (GND), the time constant is determined by the RC of the bitline 1310 and the read gate current. For reading data zero, the read gate remains OFF and the bitline stays HIGH. After the bitline signal corresponds to either a data zero (e.g., bitline voltage stays high) or a data one (e.g., bitline voltage goes low) is developed on the bitline 1310, the sense amplifier is activated and outputs the corresponding signal on a global bitline 1711. A single ended sense amplifier, such as a single ended gated diode sense amplifier, can be used.

Method of Write Operation and Voltage Boosting

Figure 18:
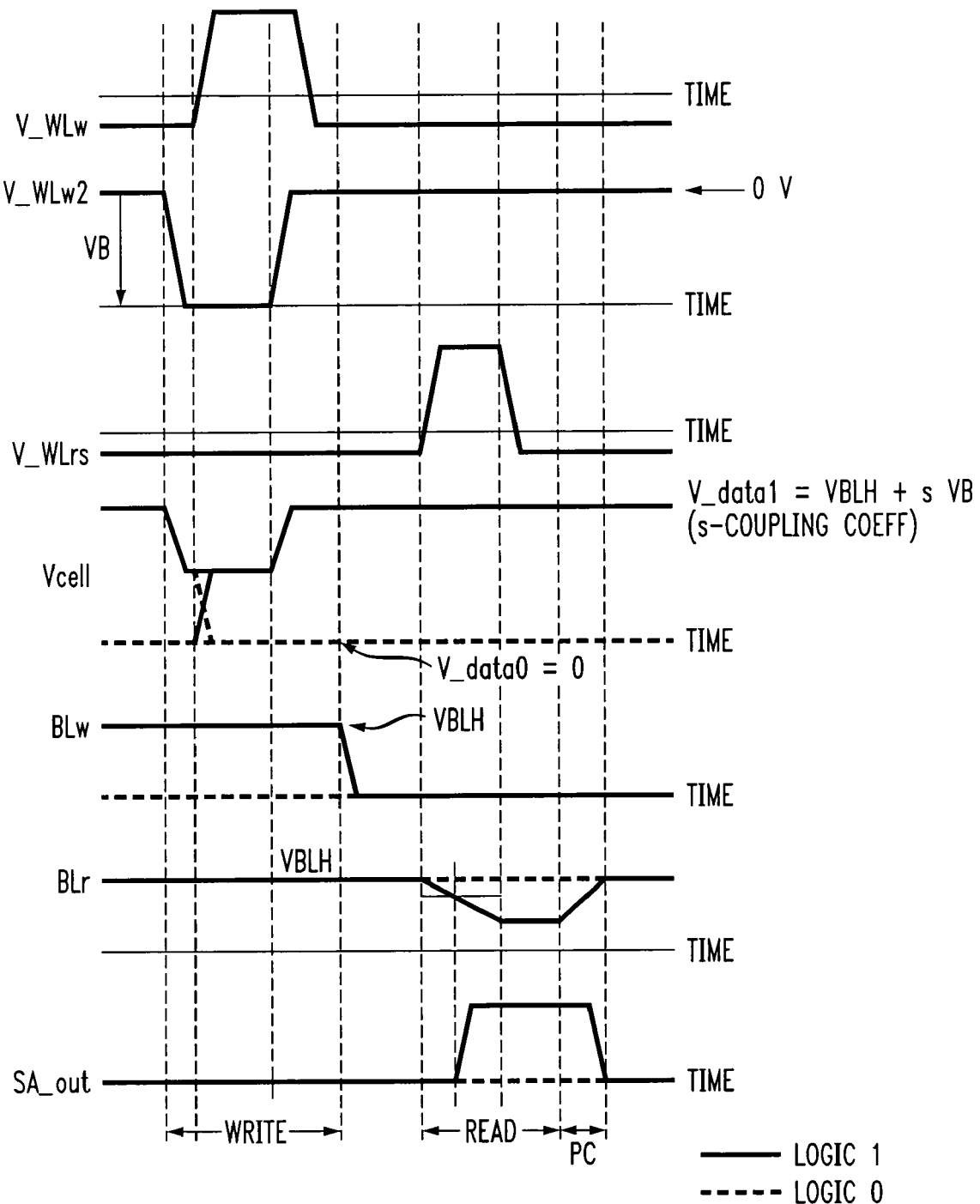
FIG. 18 shows a number of waveforms for the memory portion of FIG. 16 with write boosting.

FIG. 18 illustrates a method and the write operation of a 3T1D memory cell 1300, with voltage boosting to amplify the cell voltage during a write operation. FIG. 16 shows a memory cell with a n-type gated diode 1330. The details about the memory cell signals and controls are described earlier.

The voltage of the write wordline (WLw) 1320 is a control signal to activate a cell for writing. Its voltage is between zero volts (GND) and supply voltage (VDD), or preferably a negative voltage is used to replace the zero volts to reduce sub-threshold leakage current in those cells 1300 that are not selected. When WLw 1320 is high, the cell 1300 that connects to it is activated for writing. The voltage of the write bitline (BLw) 1305 is a signal line carrying data zero or one to write to the cell. The voltage of the read bitline (BLr) 1310 is a signal line carrying the signal generated from reading the stored data of the cell. The read bitline (BLr) 1310 is precharged to the bitline high voltage (VBLH) and is connected to a sense amplifier for signal detection and output. WLr 1335 can be use to control the gate of the read select FET (rs) 1340, to couple the FET 1340 to the bitline 1310 during a read operation. As described above, it is also desirable to add another optional control line (WLrs) 1350 to control the gate of the read select FET (rs) 1340, instead of using WLr 1335, which controls the source of the gated diode 1330. When WLrs 1350 is high, the memory cell 1300 is coupled to the bitline 1310 for read, as what WLr 1335 does. WLrs 1350 has a negative low voltage that typically is applied to the gate of the FETs 1340 when the row is not selected, as this reduces the active sub-threshold leakage current when the array is active, but that particular row is not selected.

There is a slight difference in use of the control signal in the method of write operation with boosting voltage (FIG. 18), as compared to the read operation (FIG. 17). A second additional write wordline (WLw2) is connected to drive the source of the gate diodes, instead of using WLr (e.g., WLw2 is the same line as WLr 1335 but WLw2 is used differently than WLr). This write wordline WLw2 is used to boost and amplify the voltage stored in the gated diode memory cell 1300 so that a much stronger signal is stored in the cell. Higher voltage stored enhances voltage stability for longer data retention quality and immunity to soft error due to radiation.

These exemplary method and operations in FIG. 18 involve an n-type gated diode memory cell, and the read bitline 1310 is precharged to HIGH (VBLH). The method applies accordingly to p-type gated diode and read bitline precharged to LOW (GND), operating in a complementary fashion, and such operation should be able to be determined by those who are skilled in the art.

A write boosting method is described that operates the 3T1D memory cell 1300. During a write operation, the write wordline WLw2 1335 is dropped lower at the beginning of the cycle by a magnitude VB. The voltage corresponding to data zero or data one on the write bitline (WLw) 1320 is written into the gate of the gated diode 1330. The voltage written into the cell is either zero volts for data zero, or VBLH for data one. Then the write wordline WLw2 is raised higher by an amount VB, so its voltage is back to the pre-write cycle. As a result of this rise in WLw2, the voltage stored in the cell at the gate of the gated diode 1330 is boosted higher by an amount "s VB." The final voltage of the cell is around (VBLH+s VB). When the gate voltage of the gated diode which is the same as the source voltage of the write gate is raised, the write gate 1320 is self shut off, since the source voltage is above its gate voltage plus threshold. Such rise in voltage does not result in active current or disturbance into the bitline 1305, since the write gate is OFF. If the data is a zero, there is little charge in the gated diode memory cell 1300, the voltage at the cell stays at GND, and the write gate 1320 stays ON. Also there is no active current flow through the write gate, a plus for low power operation.

After the write operation, the voltage stored in the gated diode memory cell 1300 is much higher than the original voltage (VBLH) written to the cell at the beginning of the cycle. The voltage gain mechanism and the amount of gain are detailed earlier. The advantage of this voltage boosting during write operation is that the bitline active current and power are much smaller than (typically about 50 percent) that by applying a higher voltage on the bitline and when such voltage is used to write into the memory cell 1300. A voltage gain is achieved during a write operation using this method and cell structure, which distinguishes this memory cell 1300 and its methods of use from other DRAM, SRAM and gain cells. The higher written voltage, typically about more than double, to the cell than the bitline voltage (VBLH) enhances cell voltage stability, data retention and immunity to soft errors due to radiation.

During the read operation, when the read wordline WLr 1340 is activated, the strong cell voltage for data one turns the read gate 1345 ON strongly. As the read select FET (rs) 1340 is ON, a sufficient large current is developed to discharge the bitline 1310. The bitline voltage goes towards ground (GND), the time constant is determined by the RC of the bitline 1310 and the read gate current. For reading data zero, the read gate remains OFF and the bitline stays HIGH. After the bitline signal corresponds to either a data zero (e.g., bitline voltage stays high) or a data one (e.g., bitline voltage goes low) is developed on the bitline 1310, the sense amplifier is activated and outputs the corresponding signal on a global bitline 1711.

3T1D Memory Cell Structures

1. Planar Implementation of Gated Diode

Figure 19:
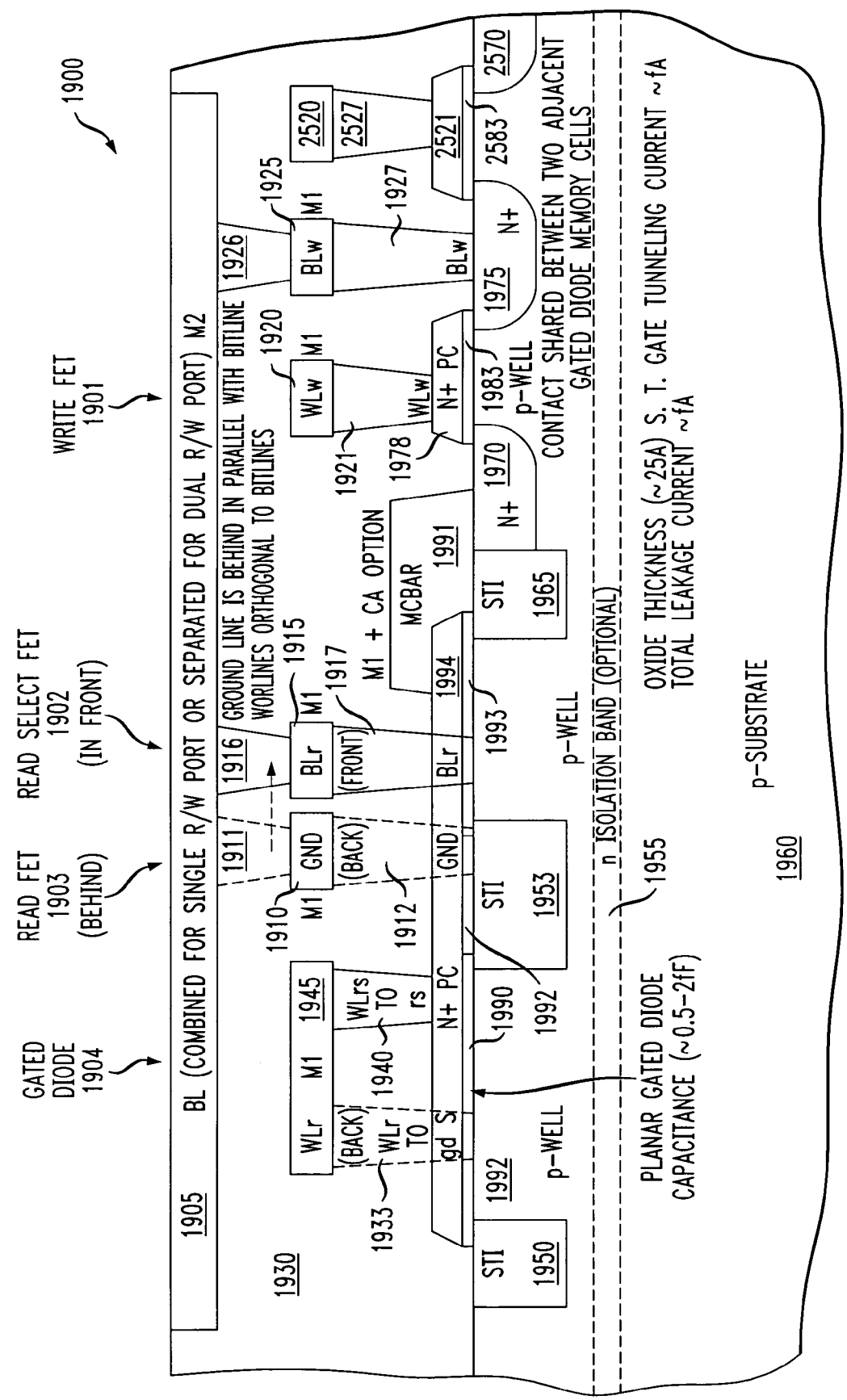
FIG. 19 shows a side view of a three-transistor, one diode (3T1D) gated diode planar memory cell implemented using Field Effect Transistor (FET) technology in bulk silicon.

The gated diode memory cell can be implemented in its simplest form of "half" of a FET with connections to only the gate and the source, as detailed earlier in the disclosure. For the planar gated diode, a very small or zero Vt device is beneficial (Vt_gd~0) to obtain as high a data one voltage in the cell when data one is written to the cell. A low level of dopant or depleted n-type FET implementation can be chosen for the gated diode. FIG. 19 shows a cross-section of an exemplary 3T1D memory cell 1900 implementation in bulk silicon using an n-type gated diode.

3T1D memory cell 1900 comprises one or more bitlines 1905, a ground 1910, two ground metal contacts 1911 and 1912, with a global ground line running every two cells to every 16 cells in parallel with the bitlines (in the figure, a ground line is shown behind a bitline), a read bitline (BLr) 1915 and its metal contacts 1916 and 1917, a write wordline (WLw) 1920 and its metal contact 1921, a write bitline (BLw) 1925 and its metal contacts 1926 and 1927, a drain diffusion area 1975, a gate 1978, a gate insulator 1983, a source diffusion area 1970, an MCBar metal contact 1991, a Shallow Trench Isolation (STI) region 1965, a polysilicon gate 1994, a read wordline (WLr) 1945 with metal contacts 1933 and 1940, STI regions 1950 and 1953, a p-well 1992, an optional n-isolation band 1955, a p-substrate 1960 and an insulating layer 1930. The gated diode 1904 is formed from the gate 1994 and the gate insulator 1990 and a source (not shown). The source of the gated diode 1904 is coupled to the WLr 1945 through metal contact 1933. The portion 1992 separates gate insulator 1990 and gate insulator 1993. Typically, the portion 1992 would be filled with polysilicon from the gate 1994.

The write FET 1901 is formed by gate 1978, gate insulator 1983, and source/drain diffusion areas 1970, 1975, and is connected to the WLw line 1920 through metal contact 1921. The read select FET 1902 is formed in front of the gate 1994, while the read FET 1903 is formed behind the gate 1994. The source (not shown) of the read select FET 1902 is connected to the drain (not shown) of the read FET 1903 (shown behind the gate 1994). The drain (not shown) of the read select FET 1902 is in front of the gate 1994 and the FET channel (not shown) for the read select FET 1902 is into the page. The source (not shown) of the read FET 1903 is connected to the GND line 1910 (behind the gate 1994) and through metal contact 1912. The gate (not shown) of the read FET 1903 is behind the gate 1994 and the FET channel (not shown) is into the page. The MCBar 1991 connects the source diffusion area 1970 to the gate of the read FET 1903. The gate 1983, gate 1994, and the gates (not shown) for the read FET 1903 and the read select FET are typically made of polysilicon that has been highly doped (e.g., N+). In this example, the writeline WLr 1933 and control line WLrs 1940 have been combined.

As shown in FIG. 19, a source diffusion area 1975 is formed as part of the write gate of a gated diode memory cell and may be shared between the write gates of two gated diode memory cells (e.g., one write gate of a gated diode memory cell formed by gate 1978, gate insulator 1983, source diffusion area 1975, etc.; the other write gate of another gated diode memory cell formed by gate 2521, gate insulator 2583, source diffusion area 1975, write wordline 2520, metal contact 2527, and drain diffusion area 2570). This structure enables two neighboring gated diode memory cells, implemented next to each other, to share the source diffusion area 1975 that can be coupled to the same bitline (BLw) for further reducing silicon area.

Figure 20:
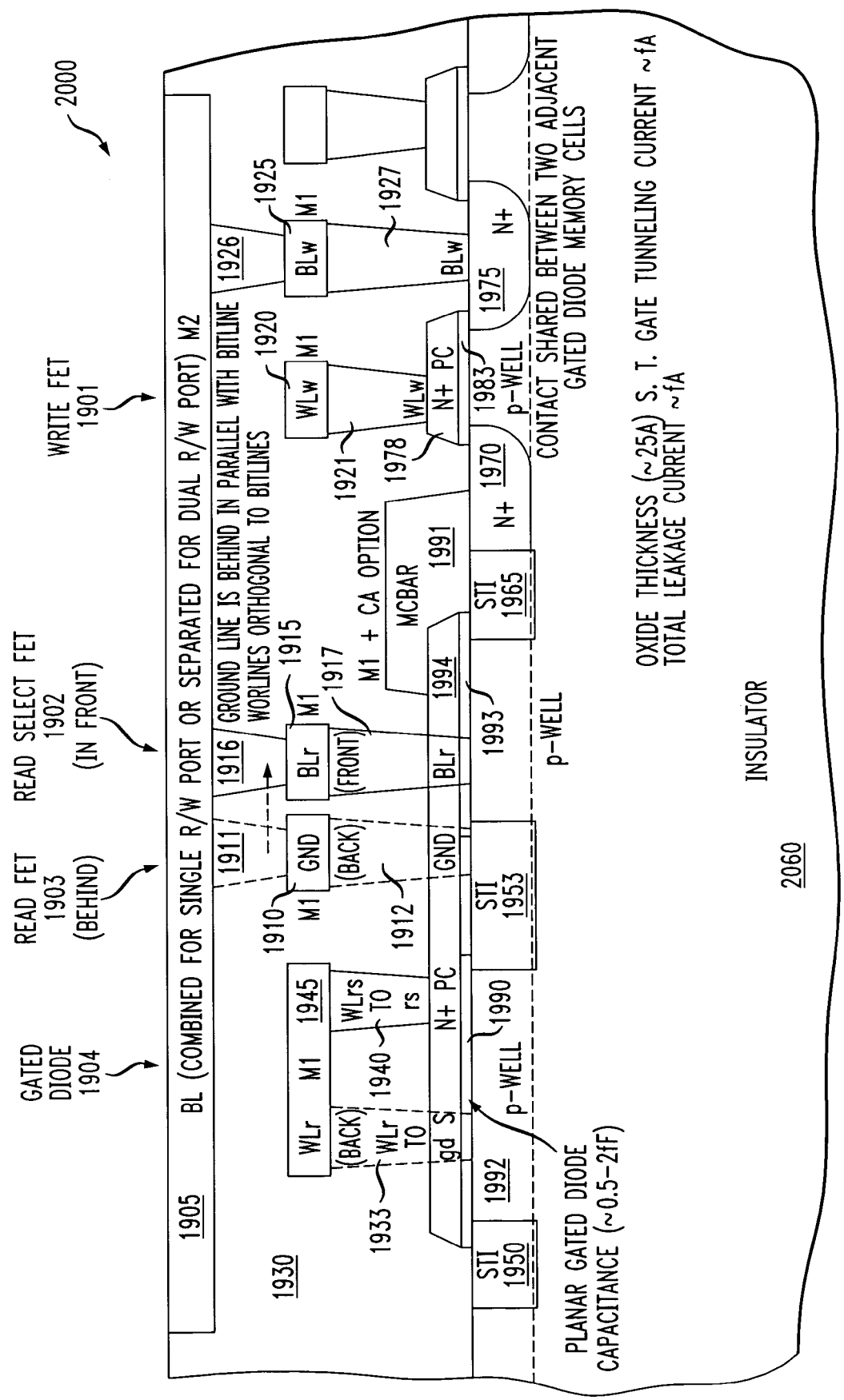
FIG. 20 shows a side view of another 3T1D gated diode planar memory cell implemented using Silicon-On-Insulator (SOI)

FIG. 20 shows a cross-section of an exemplary 3T1D memory cell implementation in SOI using an n-type gated diode. 3T1D memory cell 2000 comprises the structures shown above in FIG. 20, but formed on an insulator 2060.

2. Trench Implementation of Gated Diode

Figure 21:
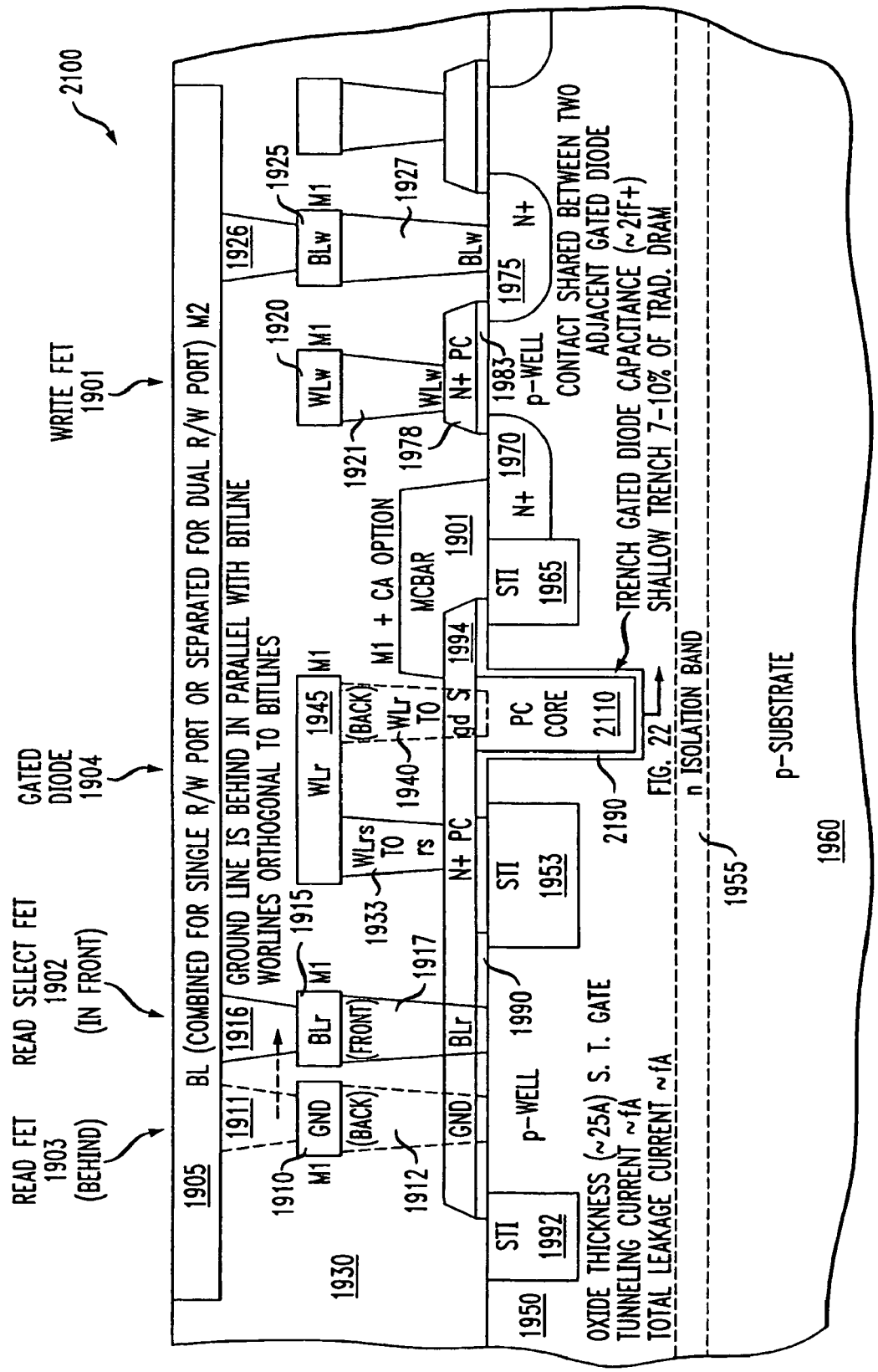
FIG. 21 shows a side view of a 3T1D gated diode trench memory cell implemented using FET technology.

FIG. 21 shows an exemplary 3T1D gated diode memory cell 2100 comprised of the structures shown above in FIG. 19. Additionally, the gated diode memory cell 2100 has a gated diode 1904 implemented in the form of a shallow trench, with the gate formed by the cylindrical polysilicon trench 2110 surrounded by thin oxide 2190 separated with the silicon 1950 underneath. It should be understood that the polysilicon trench may have any cross-sectional shape, and is not limited to the exemplary cylindrical embodiment. An area on the silicon surface next to the polysilicon trench is positively doped to form the source diffusion of the gated diode, and the polysilicon trench is the gate. This implementation has the advantage that the surface area for the gated diode is smaller, and can produce bigger capacitance (Cg_gd) to operate in the deeply constrained charge transfer region (Rc>10–100) for improved data retention and protection against soft-error rate (SER). This requires technology development on top of planar technology, and additional processing steps for embedded memory in regular planar silicon technology.

Figure 22:
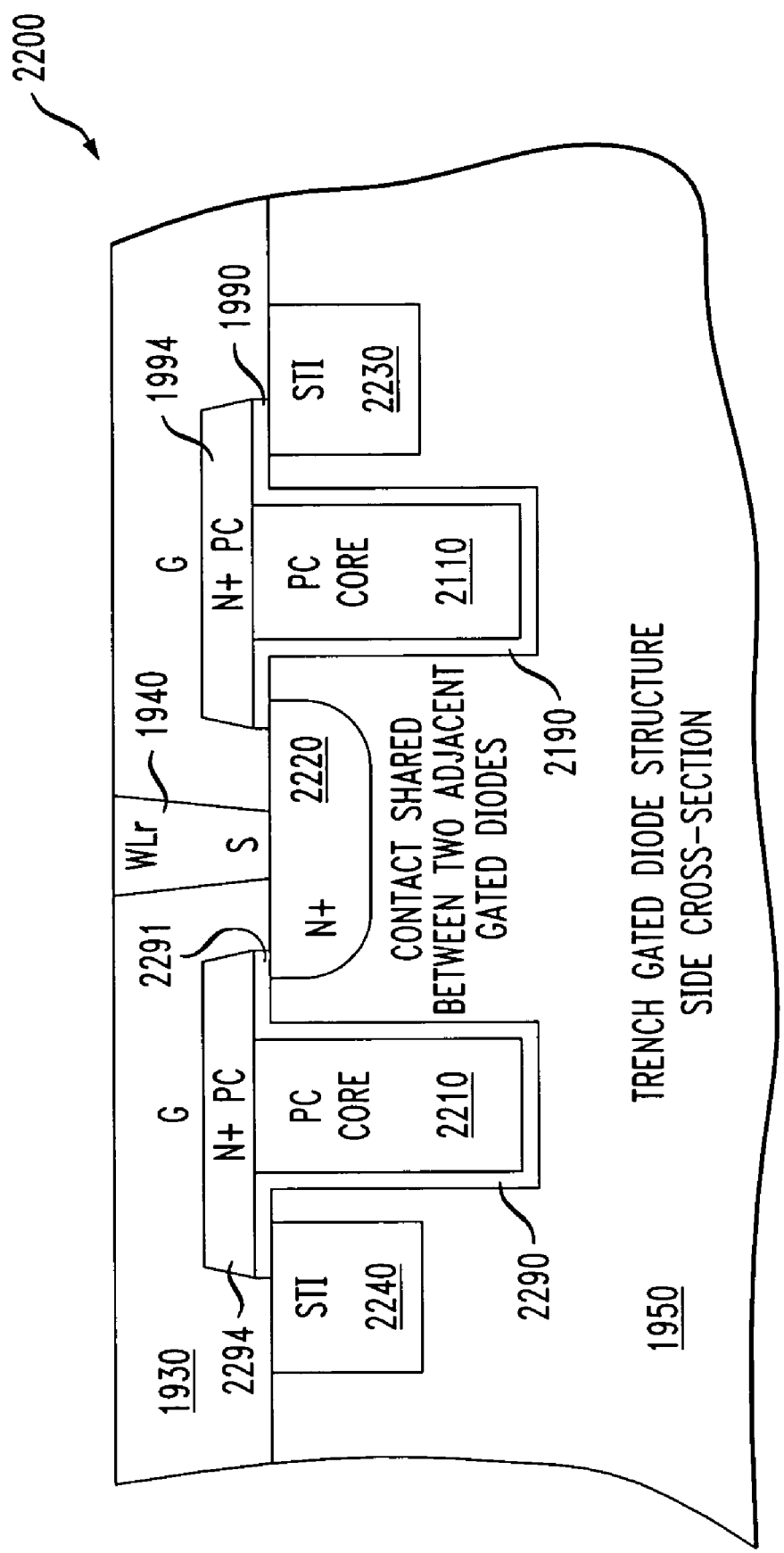
FIG. 22 shows a side cross section of two trench gated diode structure used in FIG. 21 sharing a common connection.

FIG. 22 shows a side cross section of a trench gated diode structure used in FIG. 21. There is another gate formed by the cylindrical polysilicon trench 2210 surrounded by thin oxide 2290 separated with the silicon 1950 underneath. A source diffusion area 2220 is formed as part of a gated diode and is shared between two gated diodes (one formed by gate 1994, gate insulators 2190 and 1990, polysilicon trench 2110, and source diffusion area 2220; the other formed by gate 2294, gate insulators 2290 and 2291, polysilicon trench 2210, and source diffusion area 2220). STI regions 2230 and 2240 separate the gated diodes from other devices on the semiconductor. In this example, the "gate" includes a cap portion 1994 and a trench portion 2110. The structure of FIG. 22 enables two neighboring gated diode memory cells implemented next to each other by sharing the source diffusion area that can be coupled to the same wordline (WLr) for further reducing silicon area.

In FIGS. 19–22, the bitlines and the GND lines are running in parallel with the second metal of a typical technology (M2). The wordlines are running orthogonally to the bitlines with the first metal of a typical technology (M1). Either single port, where one bitline is used for both read and write, or dual port memory cells can be implemented in the shown structure. The metal wires M1 and M2, and metal contacts shown are exemplary arrangement, and the lower level silicon structures of the three transistors and the gated diode shown are exemplary arrangement to illustrate the basic principle of operation for the 3T1D memory cell in planar bulk and SOI, trench silicon technology, other structures of 3T1D, such as p-type devices or topological equivalent structure can be devised by those skilled in the art.

3T1D Gated Diode Memory Arrays

Figure 23:
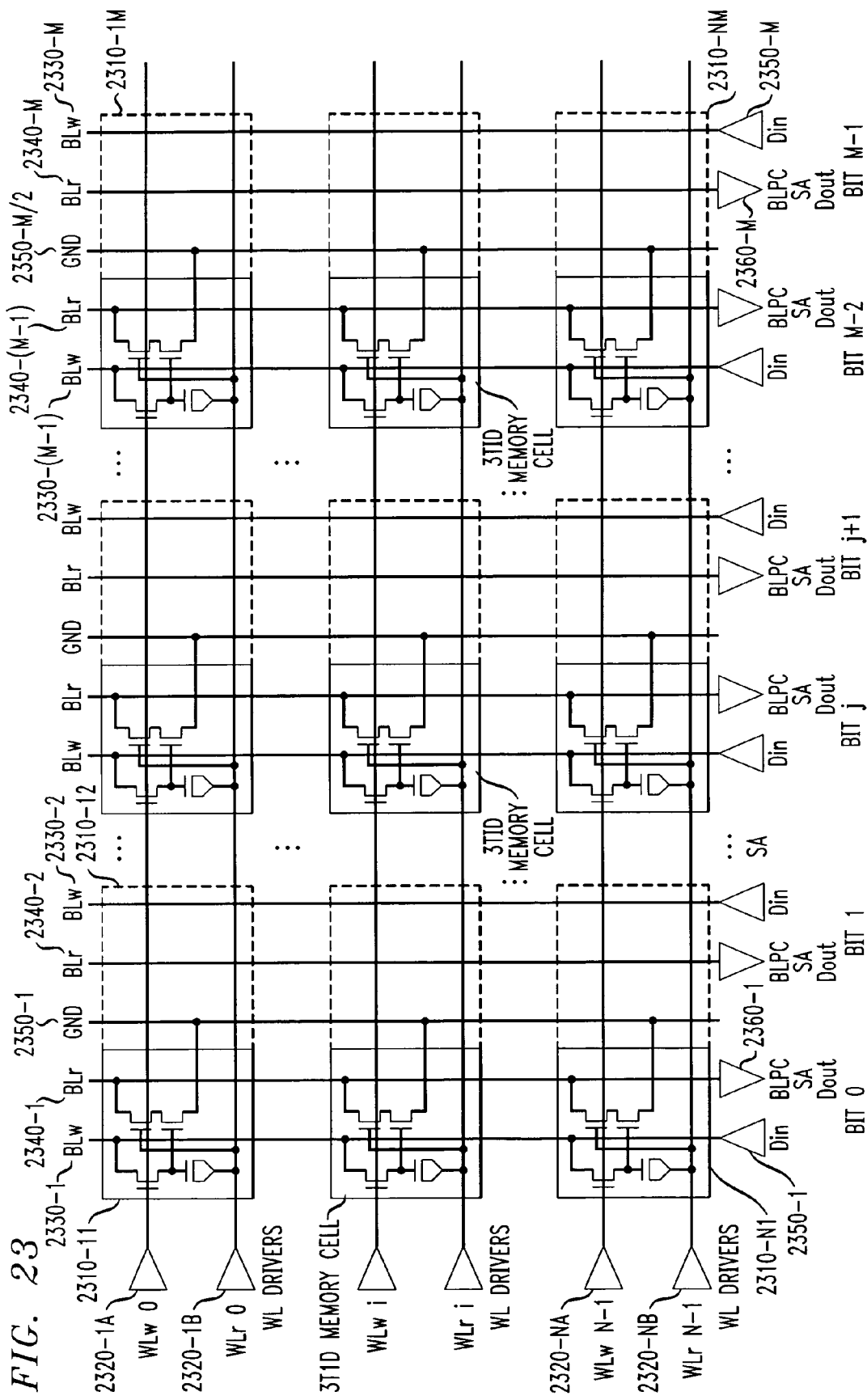

FIG. 23 shows a plurality of gated diode memory cells 2310-11 through 2310-NM formed by placing the cells in a two dimensional array, with write wordlines (coupled to drivers 2320-1A through 2320-NA) and read wordlines (coupled to drivers 2320-1B through 2320-NB) running in parallel in one direction, e.g., horizontally, and write bitlines 2330-1 through 2330-M, read bitlines 2340-1 through 2340-M and ground (GND) lines 2350-1 through 2350-M/2 running orthogonally, e.g. vertically. The intersection of a bitline and a wordline defines the location of a memory cell, or bit of data storage. Additionally, write bitline drivers 2350-1 through 2350-M and read bitline sense amplifiers 2360-1 and 2360-M are used. It should be noted that "BLPC" in the figures means bitline precharge, as the read bitlines 2340 are typically precharged during a read operation, and "SA" stands for a "sense amplifier" used for detecting the signal on the read bitline (BLr) during a read operation.

Figure 24:
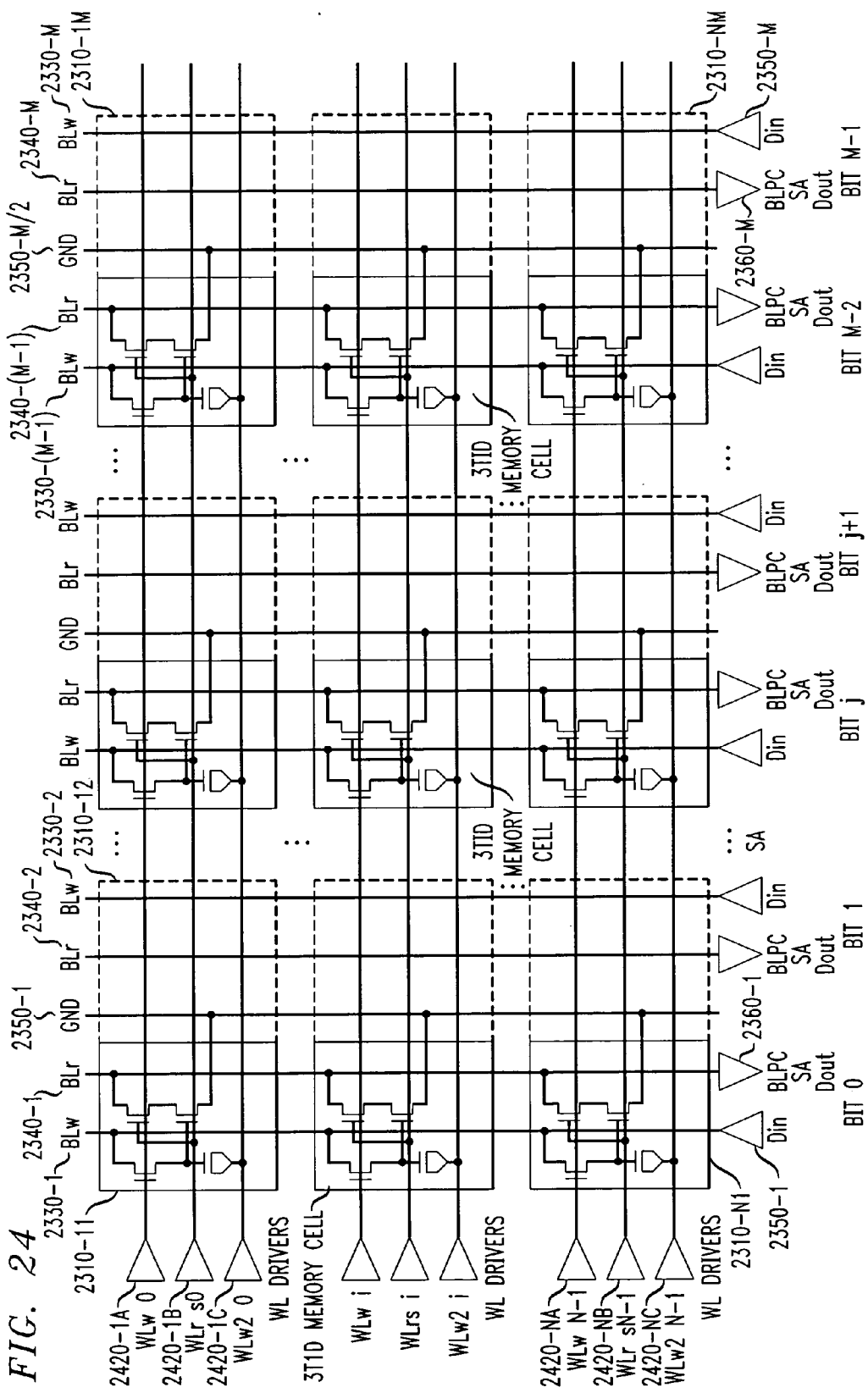

FIG. 24 shows the same array structure when write boosting is used. One additional wordline (WLw2) 2420-1C through 2420-NC is added per row, connecting to the source of the gated diodes, to provide voltage boosting during the write operation. The wordline control signal WLw2 2420-XC, X=1, . . . , N, replaces the other control signal WLr connection to the source of the gated diode under this method of operation. Additionally, WLrs lines/drivers 2420-1B through 2420-NB are coupled to the gate of the read select FETs, while WLw lines/drivers 2320-1A through 2320-NA are coupled to the write FETs.

Figure 25:
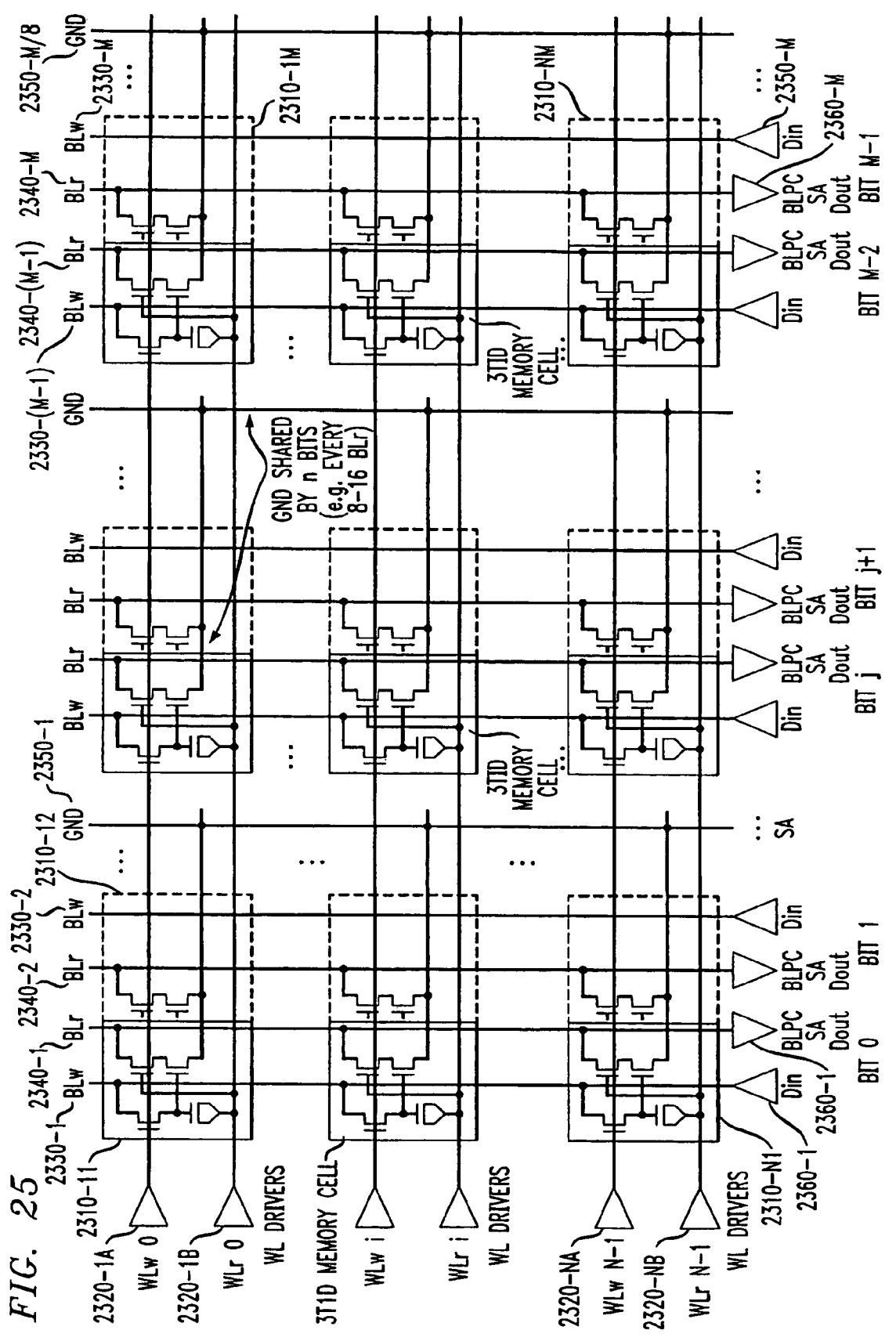

FIG. 25 shows the array of FIG. 23, only where a ground line 2350-1 through 2350-M/8 is shared over every so many (in this example, eight) bits. The ground line is connected locally, shown horizontally, for each group of eight memory cells and then to the global ground line running in parallel to the bitlines.

In FIGS. 23–25, the read and write bitlines can be separated as distinct bitlines, one for read and one for write for each column of cells, which allows dual port read/write operation. In dual port operations, read and write operations can be overlapped to certain extent, to achieve higher read/write data throughput, or shorter read/write cycle time. The read/write bitlines can also be combined into a single bitline for each column of cells, which is single port read/write operation. In single port operation, read and write operations cannot be overlapped. There are two bitlines and two wordlines pass through a single bit of memory cell for the dual port memory cell, where as one bitline and one wordline for the single port case.

Each horizontal read or write wordline drives many memory cells (typically 64 to 256 for smaller high speed array, and in some case for very high density array 1024), and each bitline (read/write) runs vertically and connects to 128–256 cells typically. The horizontal wordlines and the vertical bitlines form a memory array. Since wordlines and bitlines are long wires, so proper wordline drivers have to be designed to handle the wordline loading and R, C delay, and also proper design should be incorporated to provide enough current to drive the bitlines during read, write operations to achieve timing objectives.

Each bitline is connected to a single ended sense amplifier. An exemplary high speed sense amplifier based on a gated diode can be used, as described in Luk et al., entitled AMPLIFIERS USING GATED DIODES, U.S. patent Ser. No. 10/751,714, filed on the same day as the present application, the disclosure of which has already been incorporated by reference. The write operation, the sense amplifier write a voltage zero volts and VBLH respectively for data zero and data one to the memory cell 1300. Before a read operation, each bitline is precharged to VBLH. In the case of complementary mode of operation, where p-type gated diode 1330 is used, the bitline is precharged to GND. For n-type gated diode, during read operation, for data zero, the bitline stays at HIGH (VBLH), so the sense amplifier does not switch. When reading a data one, the bitline voltage discharges towards ground, after certain time interval of signal development on the bitline, the signal amplifier is activated, which detects the bitline signal, and either a value corresponding to a data zero or a data one is output.

For the write wordline connected to those memory cells that are not selected, a negative voltage (VWLL) can be applied to the wordlines so that the write gate 1325 of those cells that are not selected for read or write operations will have a negative gate voltage, and hence a negative gate to source voltage (Vgs), equivalent to a few decades lower in threshold voltage to reduce the sub-threshold current of the write gate 1345, hence greatly increase the retention of the cells.

For the read wordline WLr 1335, a small negative voltage can be applied to a read wordline during write operation. This has the effect of lowering the threshold voltage of the gated diodes 1330 whose source are connected to the read wordline 1310, in order to enhance the signal or the charge written into the cells.

Pertaining to the current state of technology, supply voltage VDD is about 0.8 to 1.2, and in conventional DRAM and SRAM, gain cells, bitline voltage and swing are closely related to VDD. Due to the read and write voltage boosting method for the gated diode memory cell 1300, about half of the VDD voltage is needed to apply to the cell, hence reducing power and coupling noise. So typically, VBLH is 0.4 to 0.5 V. The voltage boosting and the voltage gain property of the memory cell 1300 are able to enhance the cell signal during write or read to achieve more signal to noise margin, faster cell speed than that of conventional memory cells. Reducing bitline voltage to about half would reduce active power roughly 50 percent.

Further, due to the lower bitline voltage than that in conventional memories, the wordline voltage can be much lower because wordline boosting is not needed in order to write a higher bitline voltage into the cell. The wordline voltage (VWLH) used typically is the same as VDD, compared to much higher (about 50–75 percent more) wordline voltage needed in conventional DRAM. This simplifies the wordline voltage scheme, greatly reducing the wordline driver complexity and active power for the wordline drivers. There is a substantial area saving in the wordline drivers for the gated diode memory cells, hence achieving much better array efficiency.

For n-type gated diode memory cell, the bitlines are precharged to VBLH, and the voltage swing on the bitline is typically between 0 V (GND) and VBLH, hence it is about half that for conventional DRAM, SRAM and gain cells. This leads to low active power, refresh power, low switching noise on bitlines.

Furthermore, there is no active current flow when data zero is written and read during voltage boosting, as there is no charge stored in the gated diode memory cell. These advantages distinguish from other voltage boosting method with conventional capacitors. During read operation, the bitlines with data zero stay HIGH at VBLH, providing shielding effect to reduce switching coupling noise among bitlines.

The ground (GND) lines are running in parallel to the read and write bitlines. It provides shielding effect to reduce the switching noise coupling among bitlines during read and write operations. Further, the GND lines are structured such that the bitline to ground current are distributed across the bits of the array during read operation.

Figure 26:
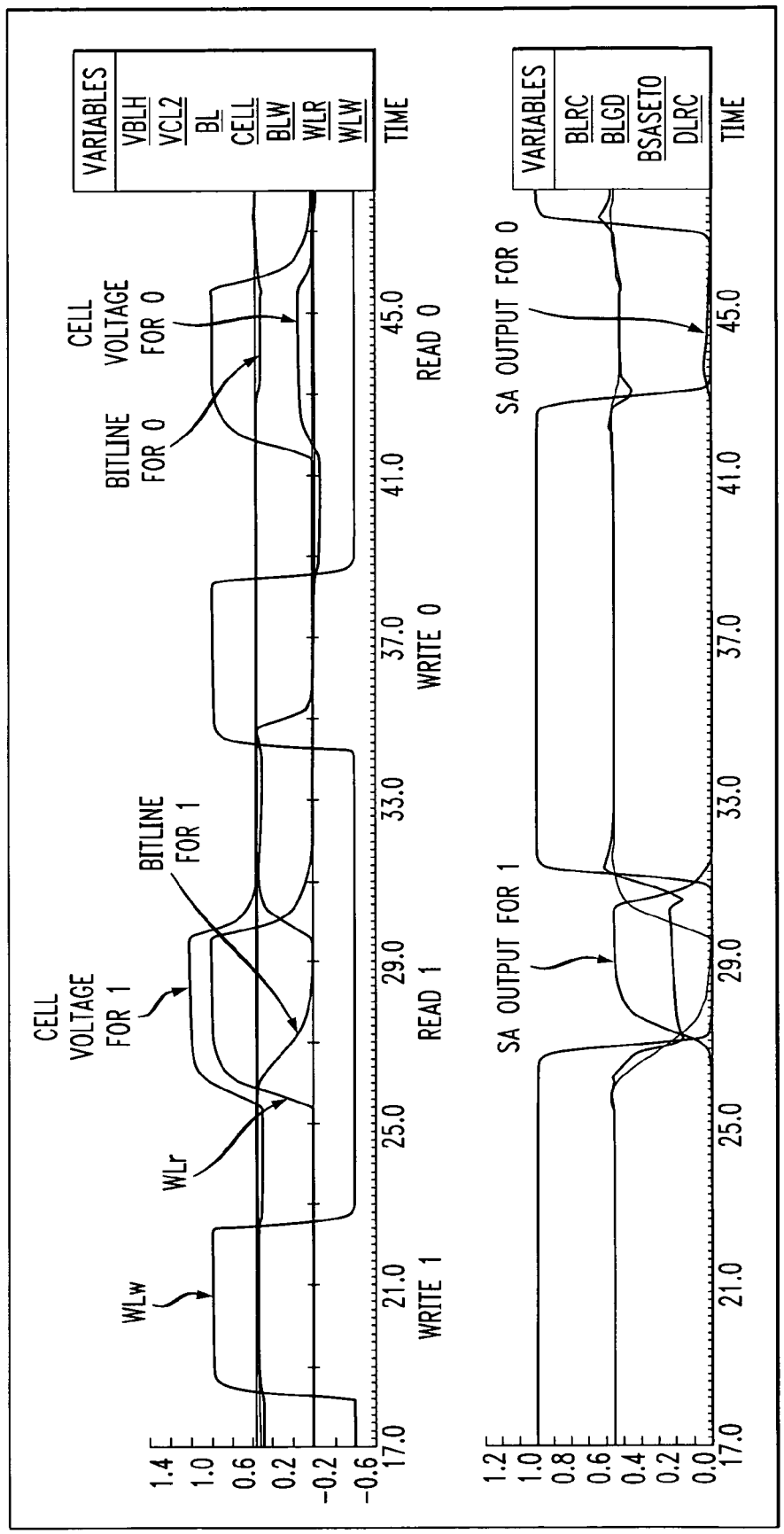
FIG. 26 is a graph used to illustrate certain waveforms for a 3T1D gated diode memory cell.

FIG. 26 shows two graphs illustrating various waveforms for a 3T1D gated diode memory cell. The top graph shows the write wordline, WLw, waveform and the read wordline, WLr, waveform. Additionally, the corresponding cell voltage and waveforms for the read bitline, BLr, and the write bitline, BLw, are shown. From the waveform of the cell voltage (shown in the top graph of FIG. 26), the cell voltage waveform highlights the key characteristic of the 3T1C memory cell, namely voltage gain of the memory cell during read operations. The cell voltage waveform shows a voltage difference of about 0.5 V between data one and data zero stored, when being read, gives rise to a voltage difference of about 1.3 V between data one and data zero, hence achieving a voltage gain of about 2.6. The bottom graph shows the Sense Amplifier (SA) output. As can be seen in FIG. 26, the cell voltage gets boosted when reading a data one and the bitline starts at a high voltage but ends at a lower voltage when reading a data one. The SA output becomes a high voltage when reading a data one. During a read of a data zero, the cell voltage only experiences a minor increase in voltage. The SA output stays a low voltage.

It is to be understood that the embodiments and variations shown and described herein are merely illustrative of the principles of this invention and that various modifications may be implemented by those skilled in the art without departing from the scope and spirit of the invention.

What is claimed is:

1. A memory cell configured to be coupled to a first control line, at least one second control line and at least one bitline for selectively accessing the memory cell, the memory cell comprising:
   a write switch having a control terminal and first and second terminals, the first terminal of the write switch coupled to the at least one bitline, the control terminal of the write switch coupled to the first control line;
   a two terminal semiconductor device having first and second input terminals, the first input terminal of the two terminal semiconductor device coupled to the second terminal of the write switch, and the second input terminal of the two terminal semiconductor device coupled to the at least one second control line, wherein the two terminal semiconductor device is adapted to have a capacitance when a voltage on the first input terminal relative to the second input terminal is above a threshold voltage and to have a lower capacitance when the voltage on the first input terminal relative to the second input terminal is less than the threshold voltage;
   a read select switch having a control terminal and first and second terminals, the control terminal of the read select switch coupled to the at least one second control line, the first terminal of the read select switch coupled to the at least one bitline; and
   a read switch having a control terminal and first and second terminals, the control terminal of the read switch coupled to the first input terminal of the two terminal semiconductor device and coupled to the second terminal of the write switch, the first terminal of the read switch coupled to the second terminal of the read select switch, and the second terminal of the read switch coupled to ground.

2. The memory cell of claim 1, wherein the two terminal semiconductor device comprises a gated diode having a gate input and a source input, the gate input being the first input terminal of the two terminal semiconductor device and the source input being the second input terminal of the two terminal semiconductor device.

3. The memory cell of claim 2, wherein the gated diode comprises an insulator formed between a gate and a well, a source diffusion region abutting and overlapping one side of the insulator and gate, and a shallow trench isolation region abutting another side of the insulator and gate, wherein the source input of the gated diode is coupled to the source diffusion region and the gate input of the gated diode is coupled to the gate.

4. The memory cell of claim 2, wherein the gated diode comprises an insulator formed between a gate and a well, a first source/drain diffusion region abutting and overlapping one side of the insulator and gate, a second source/drain diffusion region abutting and overlapping another side of the insulator and gate, and an interconnect that electrically couples the first and second source/drain diffusion regions, wherein the source input of the gated diode is coupled to the first source/drain diffusion region and the gate input of the gated diode is coupled to the gate.

5. The memory cell of claim 2, wherein the gated diode comprises an insulator formed between a well and a gate comprising a trench, and comprises a source diffusion region abutting at least a portion of the insulator, wherein the source input of the gated diode is coupled to the source diffusion region and the gate input of the gated diode is coupled to the gate.

6. The memory cell of claim 2, wherein the gated diode is an n-type gated diode.

7. The memory cell of claim 2, wherein the gated diode is a p-type gated diode.

8. The memory cell of claim 1, wherein the two terminal semiconductor device comprises a gated diode having a well and wherein the threshold voltage can be modified by modifying a dopant level in the well of the gated diode.

9. The memory cell of claim 1, wherein the write switch, read select switch, and read switch are Field Effect Transistors (FETs), each FET having a gate and two source/drain diffusion regions, a respective gate coupled to a respective control terminal, and each of respective source/drain diffusion region coupled to one of a respective first or second terminal.

10. The memory cell of claim 9, wherein the write switch, read select switch, read switch, and gated diode are n-type FETs.

11. The memory cell of claim 9, wherein the write switch, read select switch, read switch, and gated diode are p-type FETs.

12. A memory array comprising:
a plurality of first control lines;
a plurality of second control lines;
a plurality of bitlines;
a plurality of ground lines; and
a set of memory cells, each of the memory cells comprising:
a write switch having a control terminal and first and second terminals, the first terminal of the write switch coupled to at least one of the bitlines, the control terminal of the write switch coupled to the one of the first control lines;
a two terminal semiconductor device having first and second input terminals, the first input terminal of the two terminal semiconductor device coupled to the second terminal of the write switch, and the second input terminal of the two terminal semiconductor device coupled to the at least one second control line, wherein the two terminal semiconductor device is adapted to have a capacitance when a voltage on the first input terminal relative to the second input terminal is above a threshold voltage and to have a lower capacitance when the voltage on the first input terminal relative to the second input terminal is less than the threshold voltage;
a read select switch having a control terminal and first and second terminals, the control terminal of the read select switch coupled to the at least one second control line, the first terminal of the read select switch coupled to at least one of the bitlines; and
a read switch having a control terminal and first and second terminals, the control terminal of the read switch coupled to the first input terminal of the two terminal semiconductor device and coupled to the second terminal of the write switch, the first terminal of the read switch coupled to the second terminal of the read select switch, and the second terminal of the read switch coupled to a ground line.

13. The memory array of claim 12, wherein the plurality of bitlines comprises a plurality of read bitlines and a plurality of write bitlines, wherein a given one of the read bitlines is coupled to the first terminal of the read select switch for a subset of the memory cells and a given one of the write bitlines is coupled to the first terminal of the write switch for the subset of the memory cells.

14. The memory array of claim 12, wherein the plurality of bitlines comprises a plurality of single bitlines, each of the single bitlines coupled to the first terminal of the read select switch for a subset of the memory cells and to the first terminal of the write switch for the subset of the memory cells.

15. The memory array of claim 12, wherein the plurality of second control lines are a plurality of single second control lines, each of the single second control lines coupled to a subset of the memory cells.

16. The memory array of claim 12, wherein the plurality of second control lines comprises a plurality of read select control lines and a plurality of second write control lines, wherein a given read select control line is coupled to the control terminal of the read select switch for a subset of the memory cells, and a given second write control line is coupled to the second terminal of the gated diode for the subset of the memory cells.

17. The memory array of claim 12, wherein the array comprises rows and columns, wherein each subset of two memory cells in two given columns share a given ground line, and wherein there is at least one ground line per two columns.

18. The memory array of claim 12, wherein the array comprises rows and columns, wherein each subset of memory cells in multiple columns share a given ground line, and wherein multiple columns share one of the ground lines.

19. The memory array of claim 12, wherein the two terminal semiconductor device comprises a gated diode having a gate input and a source input, the gate input being the first input terminal of the two terminal semiconductor device and the source input being the second input terminal of the two terminal semiconductor device.

20. The memory array of claim 19, wherein the gated diode comprises an insulator formed between a gate and a well, a source diffusion region abutting and overlapping one side of the insulator and gate, and a shallow trench isolation region abutting another side of the insulator and gate, wherein the source input of the gated diode is coupled to the source diffusion region and the gate input of the gated diode is coupled to the gate.

21. The memory array of claim 19, wherein the gated diode comprises an insulator formed between a gate and a well, a first source/drain diffusion region abutting and overlapping one side of the insulator and gate, a second source/drain diffusion region abutting and overlapping another side of the insulator and gate, and an interconnect that electrically couples the first and second source/drain diffusion regions, wherein the source input of the gated diode is coupled to the first source/drain diffusion region and the gate input of the gated diode is coupled to the gate.

22. The memory array of claim 19, wherein the gated diode comprises an insulator formed between a well and a gate comprising a trench, and comprises a source diffusion region abutting at least a portion of the insulator, wherein the source input of the gated diode is coupled to the source diffusion region and the gate input of the gated diode is coupled to the gate.

23. The memory array of claim 19, wherein the gated diode is an n-type gated diode.

24. The memory array of claim 19, wherein the gated diode is a p-type gated diode.

25. A method for accessing a given memory cell configured to be coupled to a first control line, at least one second control line and at least one bitline, the method comprising the steps of:
modifying a voltage on the at least one second control line from a first voltage to a second voltage, the at least one second control line coupled to the given memory cell of a plurality of memory cells, the given memory cell comprising:
a write switch having a control terminal and first and second terminals, the first terminal of the write switch coupled to the at least one bitline, the control terminal of the write switch coupled to the first control line;
a two terminal semiconductor device having first and second input terminals, the first input terminal of the two terminal semiconductor device coupled to the second terminal of the write switch, and the second input terminal of the two terminal semiconductor device coupled to the at least one second control line, wherein the two terminal semiconductor device is adapted to have a capacitance when a voltage on the first input terminal relative to the second input terminal is above a threshold voltage and to have a lower capacitance when the voltage on the first input terminal relative to the second input terminal is less than the threshold voltage;
a read select switch having a control terminal and first and second terminals, the control terminal of the read select switch coupled to the at least one second control line, the first terminal of the read select switch coupled to the at least one bitline; and
a read switch having a control terminal and first and second terminals, the control terminal of the read switch coupled to the first input terminal of the two terminal semiconductor device and coupled to the second terminal of the write switch, the first terminal of the read switch coupled to the second terminal of the read select switch, and the second terminal of the read switch coupled to ground; and
returning the voltage on the at least one second control line to the first voltage.

26. The method of claim 25, wherein the method is a method for reading the given memory cell, the method further comprising the step of:

determining a data value corresponding to a state of the at least one bitline.

27. The method of claim 26, wherein:
the method further comprises the step of charging the at least one bitline to a predetermined voltage; and
the step of determining a data value corresponding to a state of the at least one bitline further comprises determining a change in state of the at least one bitline, whereby no change in state is assigned a first data value and a change in state is assigned a second data value.

28. The method of claim 26, wherein:
the at least one control line is a single control line.

29. The method of claim 28, wherein the first voltage is a predetermined low voltage and the second voltage is a predetermined high voltage.

30. The method of claim 25, wherein:
the at least one control line comprises a write control line and a read select control line.

31. The method of claim 30, wherein the step of modifying further comprises the steps of:
modifying the write control line by raising voltage from a predetermined low voltage to a predetermined high voltage; and
modifying the read select control line by raising voltage from a predetermined low voltage to a predetermined high voltage.

32. The method of claim 30, wherein:
the method further comprises the step of placing a signal on the at least one signal line;
the step of modifying further comprises the steps of:
lowering voltage on the write control line from a predetermined high voltage to a predetermined low voltage; and
raising voltage on the write control line from the predetermined low voltage to the predetermined high voltage; and
the method further comprises the step of removing the signal from the at least one signal line, the step of removing the signal performed after the step of lowering voltage.

33. A semiconductor comprising at least one semiconductor memory device, the at least one semiconductor memory device configured to be coupled to a first control line, at least one second control line and at least one bitline for selectively accessing the at least one semiconductor memory device, the at least one semiconductor memory device comprising:
a write transistor comprising an insulator formed between a gate and a well, the gate, and first and second source/drain diffusion regions formed on sides of the gate, the first source/drain diffusion region of the write transistor coupled to the at least one bitline, the gate of the write transistor coupled to the first control line;
a two terminal semiconductor device comprising at least a gated diode insulator formed between a gate and a well, the gate, and a source diffusion region that abuts at least a portion of the gated diode insulator, the gate of the two terminal semiconductor device coupled to the second source/drain diffusion region of the write switch, and the source diffusion region of the two terminal semiconductor device coupled to the at least one second control line;
a read select transistor comprising an insulator formed between a gate and a well, the gate, and first and second source/drain diffusion regions formed on sides of the gate, the gate of the read select transistor coupled to the at least one second control line, the first source/drain diffusion region of the read select transistor coupled to the at least one bitline; and a read transistor comprising an insulator formed between a gate and a well, the gate, and first and second source/drain diffusion regions formed on sides of the gate, the gate of the read transistor coupled to the first terminal of the gated diode and coupled to the second source/drain diffusion region of the write transistor, the first source/drain diffusion region of the read transistor coupled to the second source/drain diffusion region of the read select transistor and the second source/drain diffusion region of the read transistor coupled to ground.

34. The semiconductor of claim 33, wherein:

the two terminal semiconductor device is a gated diode;

the source diffusion region of the gated diode that abuts at least a portion of the gated diode insulator abuts a first side of the gated diode insulator of the gated diode, the first side of the gated diode insulator being on a first of two sides of the gate of the gated diode; and the gated diode further comprises a shallow trench isolation region abutting a second side of the gated diode insulator, the second side of the gated diode insulator being on a second of two sides of the gate of the gated diode.

35. The semiconductor of claim 33, wherein:

the two terminal semiconductor device is a gated diode;

the source diffusion region of the gated diode is a first source/drain diffusion region;

the first source/drain diffusion region of the gated diode that abuts at least a portion of the gated diode insulator abuts a first side of the gated diode insulator, the first side of the gated diode insulator being on a first of two sides of the gate of the gated diode; and the gated diode further comprises a second source/drain diffusion region abutting a second side of the insulator, the second side of the gated diode insulator being on a second of two sides of the gate of the gated diode, and the gated diode further comprises an interconnect that electrically couples the first and second source/drain diffusion regions.

36. The semiconductor of claim 33, wherein the two terminal semiconductor device is a gated diode, and wherein the gate of the gated diode is formed at least partially in a trench and the insulator separates the trench from the well and the source diffusion region.

37. The semiconductor of claim 36, wherein the trench is cylindrical.

38. The semiconductor of claim 36, wherein the gate of the gated diode further comprises a cap coupled to the trench, wherein the trench underlies the cap and wherein the insulator is formed between portions of the cap not overlying the trench and the well.

39. The semiconductor of claim 36, wherein:

the at least one semiconductor memory device comprises a first semiconductor memory device and the gated diode is a first gated diode having a first source diffusion region;

the semiconductor further comprises a second semiconductor memory device comprising a second gated diode having a second gate at least partially formed in a second trench, a second insulator formed between the second trench and the well, and a second source diffusion region abutting the second insulator; and the first source diffusion region of the first gated diode is also the second source diffusion region of the second gated diode, whereby the source diffusion area is shared between the first and second semiconductor memory devices.

40. The semiconductor of claim 39, wherein:

the first gated diode has a first trench, first gate, and first insulator;

the first trench underlies a first cap portion of the first gate;

the first insulator is formed between portions of the first cap not overlying the first trench and the well;

the second trench underlies a second cap portion of the second gate; and the second insulator is formed between portions of the second cap not overlying the second trench and the well.

41. The semiconductor of claim 33, wherein the at least one semiconductor memory device comprises a first semiconductor memory device, the semiconductor further comprises a second semiconductor memory device, and the first source/drain diffusion region of the write transistor is shared between the first and second semiconductor memory devices.

42. The semiconductor of claim 33, wherein the gate of the read select transistor and the gate of the two terminal semiconductor device are contiguous, and wherein the write transistor and the two terminal semiconductor device are separated at least by trench insulation.

* * * * *